US012581843B2

(12) United States Patent
Park et al.

(10) Patent No.: US 12,581,843 B2

(45) Date of Patent: Mar. 17, 2026

(54) DISPLAY DEVICE AND METHOD FOR MANUFACTURING THE SAME

(71) Applicant: LG DISPLAY CO., LTD., Seoul (KR)

(72) Inventors: Jiyoung Park, Seoul (KR); Miso Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 690 days.

(21) Appl. No.: 17/903,465

(22) Filed: Sep. 6, 2022

(65) Prior Publication Data

US 2023/0189621 A1 Jun. 15, 2023

(30) Foreign Application Priority Data

Dec. 13, 2021 (KR) ........................ 10-2021-0177846

(51) Int. Cl.

*H10K 59/88* (2023.01)
*H10K 59/12* (2023.01)
*H10K 59/122* (2023.01)
*H10K 71/00* (2023.01)

(52) U.S. Cl.

CPC ........... *H10K 59/88* (2023.02); *H10K 59/122* (2023.02); *H10K 71/00* (2023.02); *H10K 59/1201* (2023.02)

(58) Field of Classification Search

None

See application file for complete search history.

(56) References Cited

U.S. PATENT DOCUMENTS 8,274,211 B2 * 9/2012 Kim .................... H10K 50/125 313/504
8,847,210 B2 * 9/2014 Ko ......................... H10K 59/30 257/89
10,032,830 B2 * 7/2018 Lim ....................... H10K 59/35
10,658,438 B2 5/2020 Kim et al.
11,056,547 B2 7/2021 Lee
11,164,924 B2 11/2021 Kim et al.
2014/0239265 A1 * 8/2014 Kim ..................... H10K 59/122 438/46
2016/0307970 A1 * 10/2016 Kam .................... H10K 50/131

(Continued)

FOREIGN PATENT DOCUMENTS

KR 10-2018-0104784 A 9/2018
KR 10-2019-0107257 A 9/2019
KR 20210068851 A 6/2021

OTHER PUBLICATIONS

Office Action in Korean Appln. No. 10-2021-0177846, mailed on Apr. 29, 2025, 21 pages (with English translation).

*Primary Examiner* — Michelle Mandala

(74) *Attorney, Agent, or Firm* — Fish & Richardson P.C.

(57) ABSTRACT

A method for manufacturing a display device allows an opening pattern that opens at least some areas on a pixel defining layer between sub-pixels to be exposed to a strip solution in a process of stripping off a photoresist film and a protective film disposed on a light emitting layer, thereby increasing a dissolution speed of the protective film and reducing a difference in the dissolution speed of areas to improve uniformity of the process. In addition, in the display device of the present disclosure, a dummy light emitting layer formed on the pixel defining layer between the sub-pixels may interrupt a current flow between the sub-pixels adjacent to each other, thereby reducing a lateral leakage current that may occur between pixels adjacent to each other.

14 Claims, 29 Drawing Sheets

(56) References Cited

U.S. PATENT DOCUMENTS

| | | | | |
|---|---|---|---|---|
| 2020/0161580 | A1* | 5/2020 | Song | H10K 50/16 |
| 2020/0176533 | A1* | 6/2020 | Park | H10K 50/805 |
| 2021/0242289 | A1* | 8/2021 | Kim | H10K 59/122 |
| 2021/0327981 | A1 | 10/2021 | Lee | |
| 2022/0005895 | A1 | 1/2022 | Kim et al. | |

* cited by examiner

DISPLAY DEVICE AND METHOD FOR MANUFACTURING THE SAME

CROSS-REFERENCE TO RELATED APPLICATION

This application claims the priority of Korean Patent Application No. 10-2021-0177846 filed on Dec. 13, 2021, which is hereby incorporated by reference in its entirety.

BACKGROUND

Field of the Disclosure

The present disclosure provides a display device and a method for manufacturing a display device capable of reducing an occurrence of a lateral leakage current between sub-pixels, shortening a process time of forming the sub-pixels, and improving uniformity of the process.

Description of the Background

A display device may be implemented in a wide variety of forms, such as a television, a monitor, a smart phone, a tablet, a laptop computer, a wearable device, and the like.

Among those, display devices in which mobility is important, such as the smart phone, the tablet, the wearable device, and the like, tend to have smaller screens, but display devices, such as the television, in which a sense of immersion of the screen is more important than the mobility, tend to have larger screens.

Along with the enlargement of the screen, a demand of a consumer for a high-resolution display device is also increasing. In order to implement the high-resolution display device, the number of pixels must be increased. Therefore, in a case of a high-resolution and large-area display device, the maximum number of pixels may be densely arranged in a large-area screen.

A display device may include a plurality of pixels, and each of the plurality of pixels may include a plurality of sub-pixels having different colors.

When a light emitting layer is formed in each of the plurality of sub-pixels, the light emitting layer may be formed by being deposited using a fine metal mask (FMM) that is opened in a pattern corresponding to each sub-pixel.

When an organic light emitting layer is formed using the fine metal mask, there is a possibility that an opening of the mask may be clogged by an organic matter or the mask may be deformed by heat generated during deposition of the light emitting layer, so that a difficulty of mask management for solving problems such as foreign matters, the clogging, cleaning, and the like is high.

In particular, in order to implement a high-resolution display device, sub-pixels may be formed more densely, so that a method for forming the light emitting layer using the fine metal mask may have difficulties in realizing the high-resolution display device.

In addition, as a size of a screen of the display device increases, a difficulty of a technology of fixing and tensioning the fine metal mask such that the light emitting layer may be deposited at a precisely designed position increases significantly.

Therefore, when the fine metal mask is used to form the light emitting layer in each sub-pixel of the display device, there may be difficulties in realizing the large-area display device due to a manufacturing deviation of the mask, sagging of the mask, and the like.

In addition, because the spacing between the sub-pixels may be further reduced as the resolution increases, a lateral leakage current may occur between the sub-pixels adjacent to each other.

When the lateral leakage current occurs between the sub-pixels adjacent to each other, not only a sub-pixel that needs to be driven but also a sub-pixel that does not need to be driven may be unnecessarily driven to emit light.

SUMMARY

Accordingly, the present disclosure is to provide a display device and a method for manufacturing the same that can reduce the occurrence of the lateral leakage current between the sub-pixels of the high-resolution and large-area display device, shorten a process time for forming the sub-pixels, and improve process uniformity.

The present disclosure is also to provide a high-resolution and large-area display device and a method for manufacturing the same that may reduce damage to a light emitting layer by a process solution that may occur during a process of forming sub-pixels.

The present disclosure is also to provide a high-resolution and large-area display device and a method for manufacturing the same that may shorten a process time for forming sub-pixels and improve process uniformity.

The present disclosure is also to provide a high-resolution and large-area display device and a method for manufacturing the same that may reduce an occurrence of a lateral leakage current by interrupting a current flow in a lateral direction between sub-pixels adjacent to each other.

The present disclosure is not limited to the above-mentioned. Other advantages of the present disclosure that are not mentioned may be understood based on following descriptions, and may be more clearly understood based on the present disclosure.

In an aspect of the present disclosure, a method for manufacturing a display device includes forming a first electrode on a substrate and forming a pixel defining layer on the first electrode to separate a plurality of sub-pixels including a first sub-pixel, a second sub-pixel, and a third sub-pixel from each other, forming a first protective film and a first photoresist film so as to cover the first electrode and the pixel defining layer, patterning the first photoresist film and the first protective film to form a first opening pattern corresponding to the first sub-pixel and at least some areas of the pixel defining layer between the second sub-pixel and the third sub-pixel, forming a first light emitting layer and a first dummy light emitting layer corresponding to the first opening pattern, and stripping t off he first photoresist film and the first protective film.

In another aspect of the present disclosure, a method for manufacturing a display device includes forming a first electrode on a substrate and forming a pixel defining layer on the first electrode to separate a plurality of sub-pixels from each other, forming a protective film and a photoresist film so as to cover the first electrode and pixel defining layer, patterning the photoresist film and the protective film to form an opening pattern that opens at least one sub-pixel of the plurality of sub-pixels and opens at least some areas of the pixel defining layer between the sub-pixels that are not opened, depositing a light emitting layer and a dummy light emitting layer corresponding to the opening pattern; and stripping off the photoresist film and the protective film, and the forming of the photoresist film and the protective film to the stripping off the photoresist film and the protective film are repeated as many as the number of colors constituting the plurality of sub-pixels.

In another aspect of the present disclosure, a display device includes a substrate, a first electrode disposed on the substrate, a pixel defining layer disposed on the first electrode to separate a plurality of sub-pixels from each other, a light emitting layer disposed on the first electrode, a dummy light emitting layer disposed on the pixel defining layer, and a second electrode disposed on the light emitting layer and the dummy light emitting layer, and the dummy light emitting layer is disposed to be spaced apart from a light emitting layer having the same color and is disposed at least partially overlapping with one or more light emitting layers having different colors.

In another aspect of the present disclosure, a display device includes a substrate, a first electrode disposed on the substrate, a pixel defining layer disposed on the first electrode to separate a plurality of sub-pixels from each other, a light emitting layer disposed on the first electrode, a dummy light emitting layer disposed on the pixel defining layer and including an constant-spacing dummy light emitting layer and a varying-spacing dummy light emitting layer, and a second electrode disposed on the light emitting layer and the dummy light emitting layer, the constant-spacing dummy light emitting layer is spaced apart from a boundary of an adjacent sub-pixel so as to have an equal width, and the varying-spacing dummy light emitting layer is spaced apart from the boundary of the adjacent sub-pixel so as to have an increasing or decreasing width.

In various aspects of the present disclosure, the protective film is formed between the light emitting layer and the photoresist film, so that the damage of the light emitting layer by the process solution such as a photoresist film forming solution (or a developer) can be reduced.

In various aspects of the present disclosure, in the process of stripping off the photoresist film and the protective film disposed on the light emitting layer, the opening pattern that opens at least some areas on the pixel defining layer between the sub-pixels is included and the opening pattern is exposed to the strip solution, so that the dissolution speed of the protective film by the strip solution may be increased and the difference in the dissolution speed of the areas may be reduced, thereby improving the uniformity of the process.

In various aspects of the present disclosure, the dummy light emitting layer is formed on the pixel defining layer between the sub-pixels, the dummy light emitting layer may interrupt the current flow between the sub-pixels adjacent to each other, thereby reducing the lateral leakage current that may occur between the pixels adjacent to each other.

Effects of the present disclosure are not limited to the above-mentioned effects, and other effects as not mentioned will be clearly understood by those skilled in the art from following descriptions.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
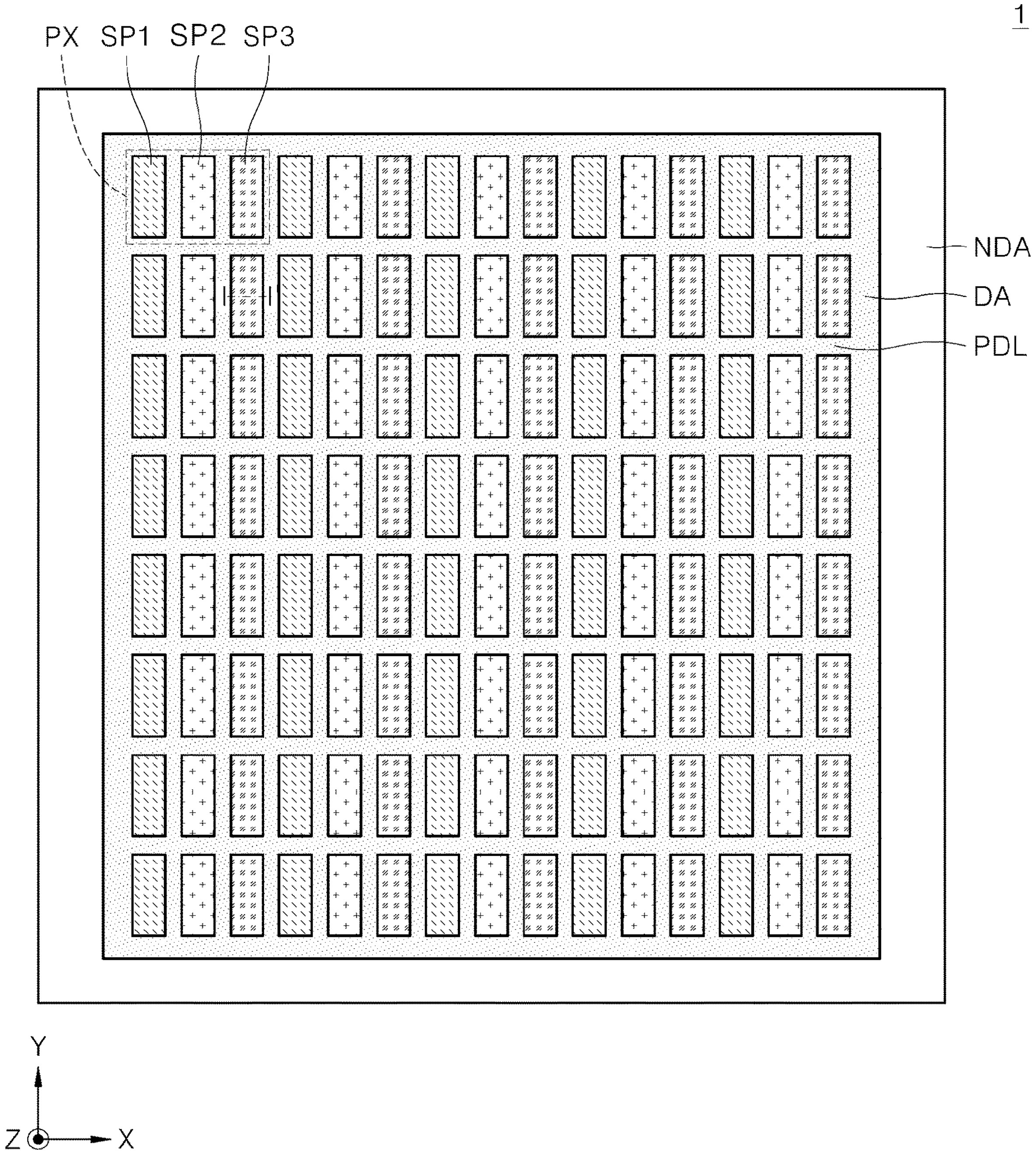
FIG. 1 is a plan view of a display device according to an aspect of the present disclosure.

Advantages and features of the present disclosure, and a method of achieving the advantages and features will become apparent with reference to aspects described later in detail together with the accompanying drawings. However, the present disclosure is not limited to aspects as disclosed below, but may be implemented in various different forms. Thus, these aspects are set forth only to make the present disclosure complete, and to completely inform the scope of the present disclosure to those of ordinary skill in the technical field to which the present disclosure belongs, and the present disclosure is only defined by the scope of the claims.

A shape, a size, a ratio, an angle, a number, etc. disclosed in the drawings for describing the aspects of the present disclosure are illustrative, and the present disclosure is not limited thereto. The same reference numerals refer to the same elements herein. In other instances, well-known methods, procedures, components, and circuits have not been described in detail so as not to unnecessarily obscure aspects of the present disclosure. It will be further understood that the terms “comprise”, “including”, “include”, and “including” when used in this specification, specify the presence of the stated features, integers, operations, elements, and/or components, but do not preclude the presence or addition of one or more other features, integers, operations, elements, components, and/or portions thereof. As used herein, the singular constitutes “a” and “an” are intended to include the plural constitutes as well, unless the context clearly indicates otherwise.

In interpreting a numerical value, the value is interpreted as including an error range unless there is no separate explicit description thereof.

In descriptions of positional relationships, for example, when a positional relationship of two portions is described with ‘on’, ‘on top of’, ‘beneath’, ‘next to’, etc., one or more other portions may be placed between the two portions unless ‘immediately’ or ‘directly’ is used.

In descriptions of temporal relationships, for example, temporal precedent relationships between two events such as “after”, “subsequent to”, “before”, etc., another event may occur therebetween unless “directly after”, “directly subsequent” or “directly before” is not indicated.

It will be understood that, although the terms “first”, “second”, “third”, and so on may be used herein to describe various elements, components, areas, layers and/or sections, these elements, components, areas, layers and/or sections should not be limited by these terms. These terms are used to distinguish one element, component, area, layer or section from another element, component, area, layer or section. Thus, a first element, component, area, layer or section described below could be termed a second element, component, area, layer or section, without departing from the spirit and scope of the present disclosure.

The features of the various aspects of the present disclosure may be partially or entirely combined with each other, and may be technically associated with each other or operate with each other. The aspects may be implemented independently of each other and may be implemented together in an association relationship.

Hereinafter, various components of a display device and a method for manufacturing the same that may reduce an occurrence of a lateral leakage current between sub-pixels of the high-resolution and large-area display device, shorten a process time of forming the sub-pixels, and improve uniformity of a process will be described in detail.

FIG. 1 is a plan view of a display device according to an aspect of the present disclosure.

A display device 1 may include a display area DA and a non-display area NDA surrounding the display area DA.

In the display area DA, a plurality of pixels PX displaying an image in response to signals supplied to signal lines may be repeatedly arranged.

Arrangement forms of the plurality of pixels PX may be various, but hereinafter, an arrangement of the plurality of pixels PX in a form of a matrix will be described as an aspect.

One pixel PX may include a plurality of sub-pixels SP1, SP2, and SP3.

For example, one pixel PX may include a first sub-pixel SP1, a second sub-pixel SP2, and a third sub-pixel SP3.

In this case, the first sub-pixel SP1 may be a sub-pixel having a color of red R, the second sub-pixel SP2 may be a sub-pixel having a color of green G, and the third sub-pixel SP3 may be a sub-pixel having a color of blue B.

In addition, for example, one pixel PX may include the first sub-pixel SP1, the second sub-pixel SP2, the third sub-pixel SP3, and a fourth sub-pixel SP4.

The first sub-pixel SP1 may be the sub-pixel having the color of red, the second sub-pixel SP2 may be the sub-pixel having the color of green, the third sub-pixel SP3 may be the sub-pixel having the color of blue, and the fourth sub-pixel SP4 may be a sub-pixel having a color of white.

Referring to FIG. 1, each of the sub-pixels SP1, SP2, and SP3 is illustrated as having a rectangular shape, but the present disclosure is not limited thereto. Each of the sub-pixels SP1, SP2, and SP3 may have various shapes, such as a triangular shape, a rhombic shape, a pentagonal shape, a circular shape, an elliptical shape, and the like, as needed.

The plurality of sub-pixels SP1, SP2, and SP3 may be separated into the respective sub-pixels SP1, SP2, and SP3 by a pixel defining layer PDL.

Accordingly, the pixel defining layer PDL is disposed between the sub-pixels SP1, SP2, and SP3 to define boundaries between the sub-pixels SP1, SP2, and SP3 having the different colors and prevent color mixing.

In the non-display area NDA, a pad to which a data driver or a gate driver for applying the various signals to the pixel PX of the display area DA may be connected may be disposed.

Figure 2:
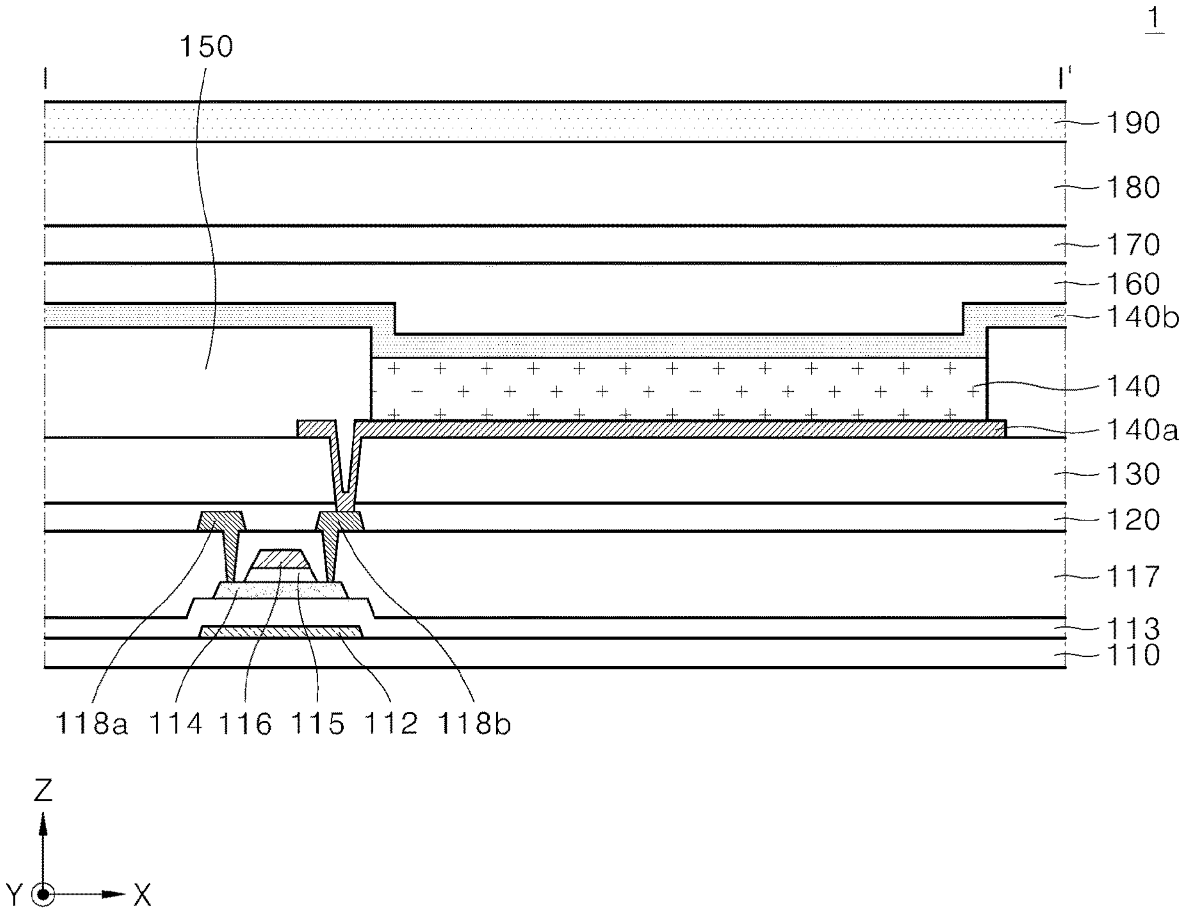
FIG. 2 is a cross-sectional view corresponding to one sub-pixel of a display device according to an aspect of the present disclosure.

FIG. 2 is a cross-sectional view corresponding to one sub-pixel of a display device according to an aspect of the present disclosure.

Referring to FIG. 2, a buffer layer 113 may be formed on the substrate 110, and a switching thin-film transistor including an active layer 114, a gate electrode 116, a source electrode 118*a*, and a drain electrode 118*b* may be disposed on the buffer layer 113.

A light-blocking layer 112 capable of preventing light from being incident on the active layer 114 of the switching thin film transistor may be disposed between the substrate 110 and the buffer layer 113.

A gate insulating layer 115 capable of electrically insulating the active layer 114 and the gate electrode 116 from each other may be disposed between the active layer 114 and the gate electrode 116.

An interlayer insulating layer 117 may be disposed on the active layer 114 and the gate electrode 116. The source electrode 118*a* and the drain electrode 118*b* may be electrically connected to the active layer 114 via contact holes extending through the interlayer insulating layer 117, respectively.

An organic light emitting diode (OLED) including a first electrode 140*a* electrically connected to the switching thin-film transistor, a light emitting diode layer 140 electrically connected to the first electrode 140*a*, and a second electrode 140*b* electrically connected to the light emitting diode layer 140 may be disposed on the switching thin-film transistor.

In the present disclosure, an organic light emitting display device including the light emitting device layer 140 that is the organic light emitting diode (OLED) will be described as an aspect.

The first electrode 140*a* may be an anode electrode, and the second electrode 140*b* may be a cathode electrode.

A first passivation layer 120 and an overcoat layer 130 may be disposed between the switching thin-film transistor and the first electrode 140*a*.

The first passivation layer 120 may be made of an inorganic matter, and the overcoat layer 130 may be made of an organic matter.

The first electrode 140*a* may be electrically connected to the drain electrode 118*b* of the switching thin-film transistor through the contact hole defined in the first protective film 120 and the overcoat layer 130.

The organic light emitting diode may be implemented to emit light of a different color, such as red, green, and blue light for each sub-pixel.

For example, the light emitting diode layer 140 of the organic light emitting diode may include light emitting layers that emit the red, green, and blue light, and the light emitting layer may be made of a phosphorescent material or a fluorescent material and a specific material thereof may not be particularly limited.

A hole injection layer HIL and/or a hole transporting layer HTL may be additionally disposed between the first electrode 140*a* and the light emitting layer, and an electron transporting layer ETL and/or an electron injection layer HIL may be disposed between the light emitting layer and the second electrode 140*b*.

A bank layer 150 may be disposed at a boundary between the respective light emitting diode layers 140 so as to reduce mixing of the colors of the light emitting diode layers 140 exhibiting the different colors.

The bank layer 150 may be defined as the pixel defining layer that divides the sub-pixels SP1, SP2, and SP3 from each other.

A planarization layer 160 and a second passivation layer 170 may be disposed on the second electrode 140*b*.

The planarization layer 160 may be made of the organic matter, and the second passivation layer 170 may be made of the inorganic matter.

A sealing layer 190 may be disposed on the second passivation layer 170 to prevent moisture or foreign substances from penetrating into the light emitting diode layer 140. The sealing layer 190 may be disposed to be fixed by an adhesive layer 180.

FIGS. 3A-3D are process diagrams for a method for manufacturing a display device according to an aspect of the present disclosure, and specifically, are process diagrams illustrating a process of forming the light emitting diode layer including the plurality of light emitting layers in a patterning method using a photolithography process.

A method for forming a pattern for each layer to be described below uses a photolithography process that includes deposition, photoresist coating (PR coating), exposure, development, etching, and photoresist strip (PR strip), which are techniques performed by those skilled in the art. Therefore, a detailed description thereof will be omitted. For example, in a case of the deposition, methods such as sputtering for a metal material and plasma enhanced vapor deposition (PECVD) for a semiconductor or an insulating film may be used separately. Even in a case of the etch, dry etch and wet etch may be selected and used depending on a material. Therefore, techniques performed by those skilled in the art may be applied.

Figure 3A:
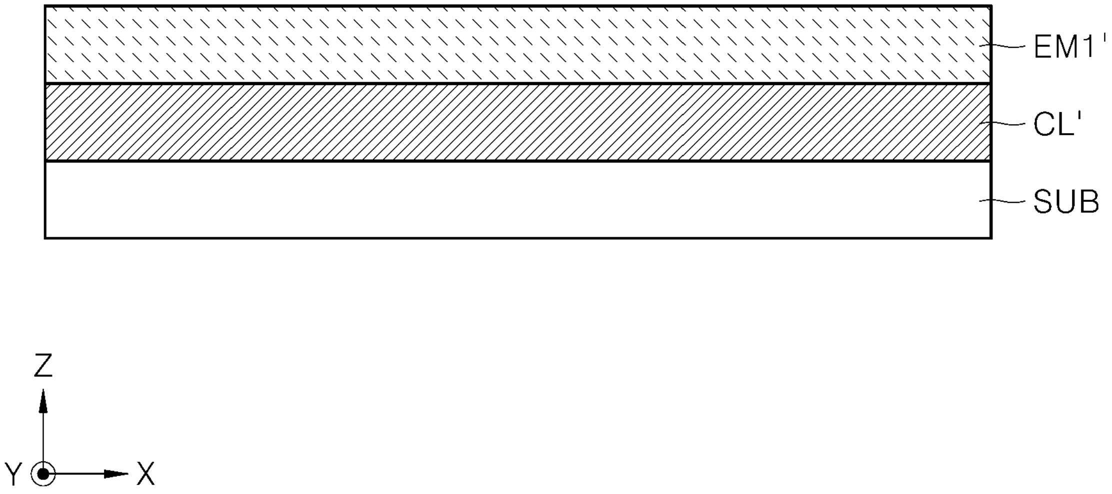
FIGS. 3A-3D are process diagrams for a method for manufacturing a display device according to an aspect of the present disclosure.

Referring to FIG. 3A, a common film CL' and a first light emitting film EM1' may be sequentially stacked on a substrate SUB using the deposition process.

After the deposition process is completed, a cleaning process for removing foreign substances on the substrate SUB may be performed.

The common film CL' may be an electrode film for forming an anode electrode of the light emitting diode layer, and may also include an auxiliary film for forming the hole injection layer HIL and/or the hole transporting layer HTL.

The first light emitting film EM1' may be made of a material for forming the red light emitting layer.

In the present disclosure, it is described for convenience of description that the first light emitting film EM1' containing a material having the red color is first formed, but an order of formation of the colors of the light emitting films is not limited thereto. In addition, a second light emitting film or a third light emitting film containing a material of the green or blue color may be formed first.

Figure 3B:
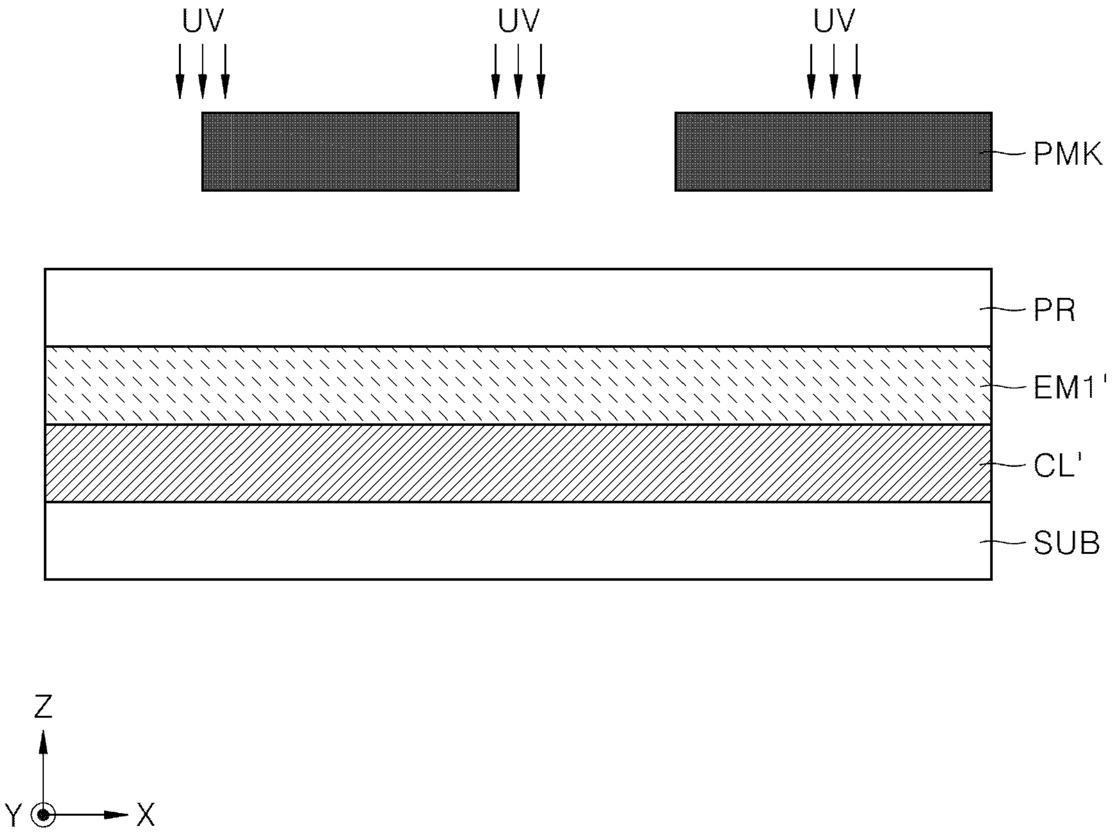

Referring to FIG. 3B, a photoresist film PR may be formed on the first light emitting film EM1', and the photoresist film PR, the first light emitting film EM1', and the common film CL' may be patterned using the photolithography process.

For example, the exposure process of exposing the photoresist film PR to an ultraviolet ray (UV) may be performed via a photomask PMK having a pattern of a first light emitting layer EM1 to be formed.

Figure 3C:
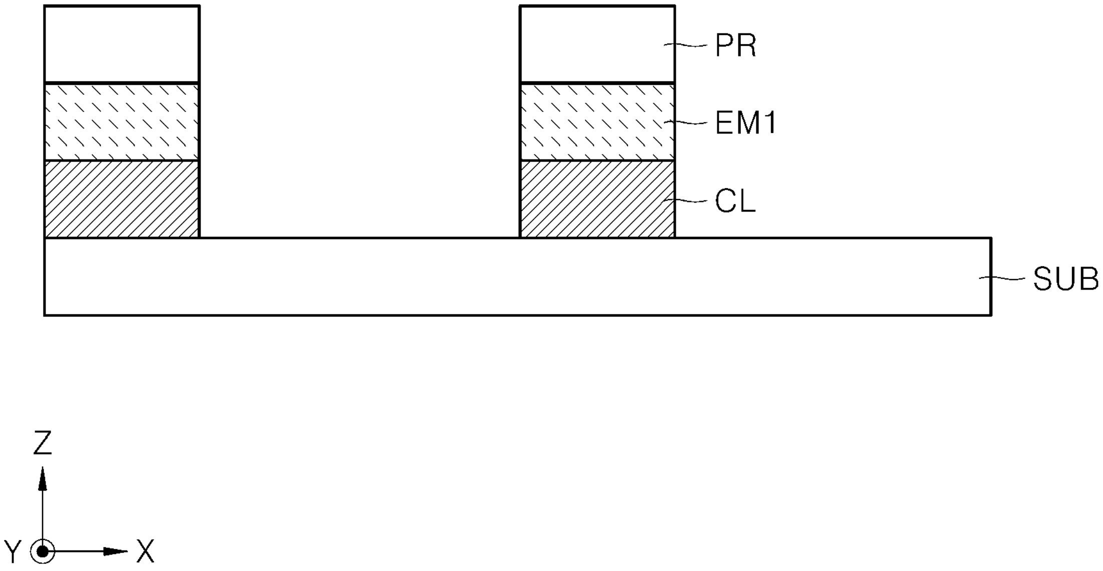

Referring to FIG. 3C, the photoresist film PR exposed to the ultraviolet ray (UV) may be developed with a developer to be patterned with the pattern of the photomask PMK, and the first light emitting film EM1' and the common film CL' may be etched with the pattern of the photomask PMK via the etching process to form the first light emitting layer EM1 and a common layer CL, respectively.

The residual photoresist film PR may be removed by being peeled via the strip process.

Figure 3D:
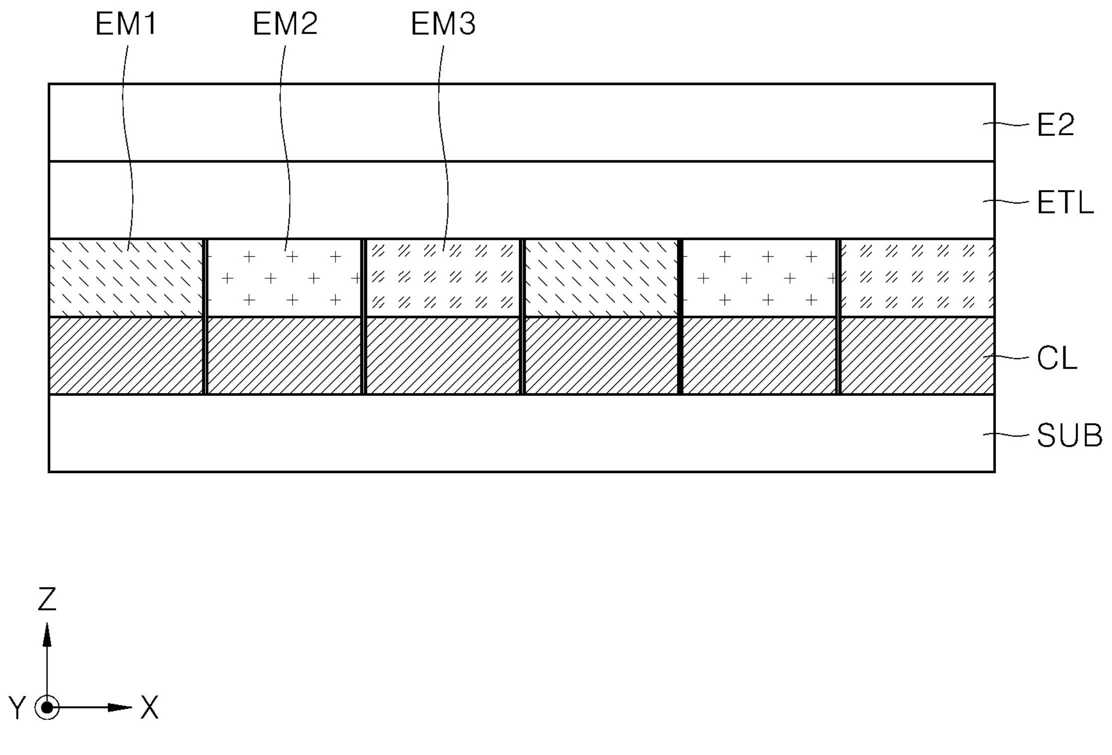

Referring to FIG. 3D, a second light emitting layer EM2 and a third light emitting layer EM3 may be additionally formed by repeating the processes in FIGS. 3A-3C described above.

An auxiliary layer forming the electron injection layer EIL and/or the electron transporting layer ETL, and a second electrode E2 may be formed on the first light emitting layer EM1, the second light emitting layer EM2, and the third light emitting layer EM3.

When the plurality of light emitting layers are formed in the patterning method using the photolithography process as described above, there are advantages on the process as follows.

For example, compared to the process using the fine metal mask (FMM), there is no need to manufacture a separate mask for the deposition of the organic matter such as the light emitting layer, and there is no need for a separate mask management process, such as foreign substance management, clogging management, cleaning, and the like caused by the organic matter that may be deposited on the mask in the deposition process.

In addition, when the plurality of light emitting layers are formed by the patterning method using the photolithography process, compared to the process using the fine metal mask (FMM), very high resolution may be realized because it is easy to implement sub-pixels that are arranged with a relatively fine spacing.

However, when the plurality of light emitting layers are formed by the patterning method using the photolithography process, while performing the process such as the wet etching, the light emitting layer containing the organic matter may be damaged by the moisture, the oxygen, and a process solution such as the developer or a strip solution.

When the light emitting layer is damaged, a driving voltage may be increased and an efficiency and a lifespan of the light emitting diode may be reduced.

In addition, there may be difficulties in applying the cleaning process or a rework process using deionized water (DI water) used in a post-process of the photolithography process.

Accordingly, a method for manufacturing a display device according to another aspect of the present disclosure will be described below with reference to FIGS. 4 to 13A and FIG. 4 to FIG. 13B.

The method for manufacturing the display device according to another aspect of the present disclosure with reference to FIGS. 4A, 5A, 6A, 7A, 8A, 9A, 10A, 11A, 12A and 13A and FIGS. 4B, 5B, 6B, 7B, 8B, 9B, 10B, 11B, 12B and 13B may form the light emitting diode layer including the plurality of light emitting layers in the patterning method using the photolithography process.

Figure 4A:
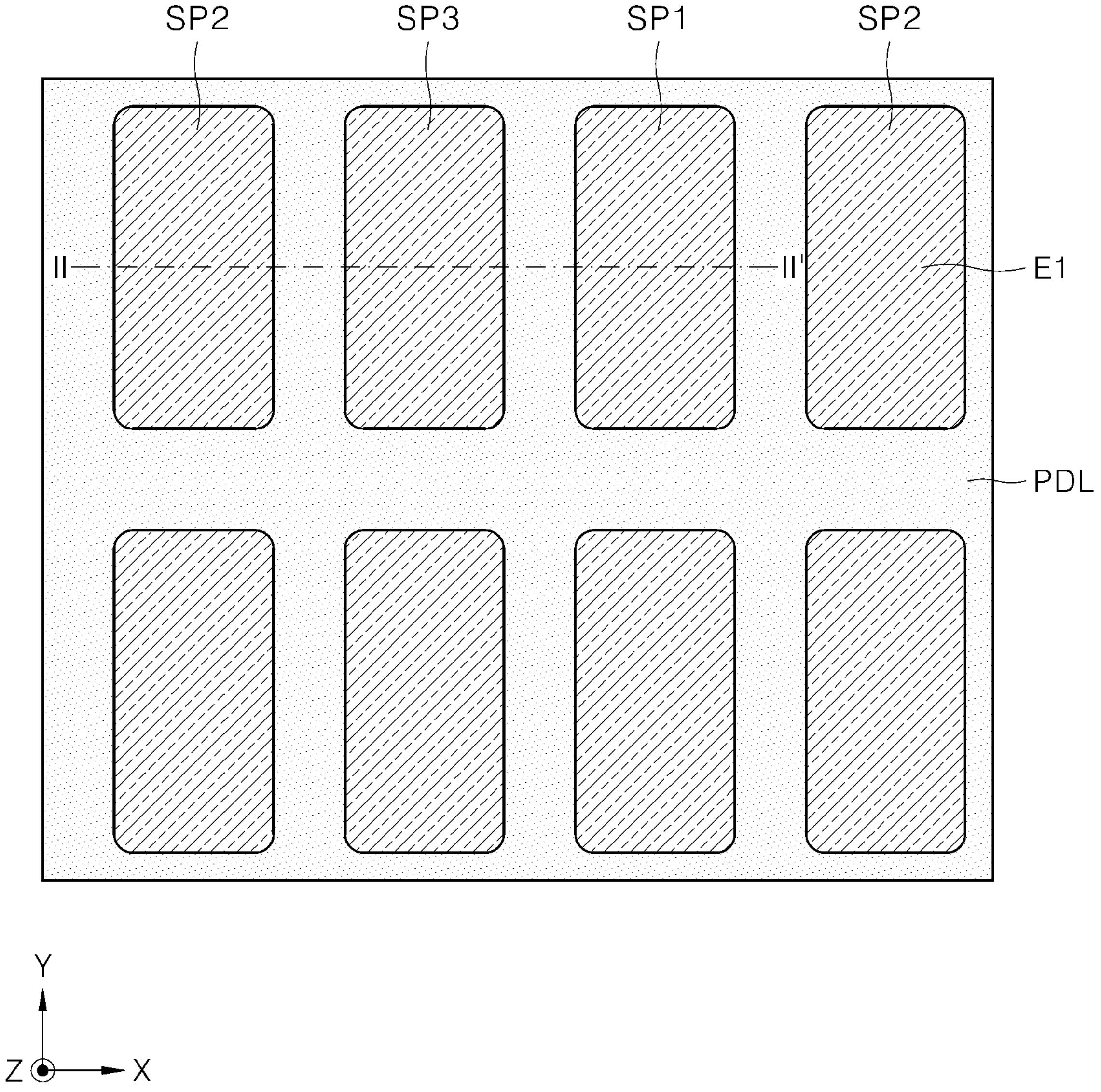
FIGS. 4A, 5A, 6A, 7A, 8A, 9A, 10A, 11A, 12A and 13A and FIGS. 4B, 5B, 6B, 7B, 8B, 9B, 10B, 11B, 12B and 13B are respectively process plan views and process cross-sectional views of a method for manufacturing a display device according to another aspect of the present disclosure.
Figure 4B:
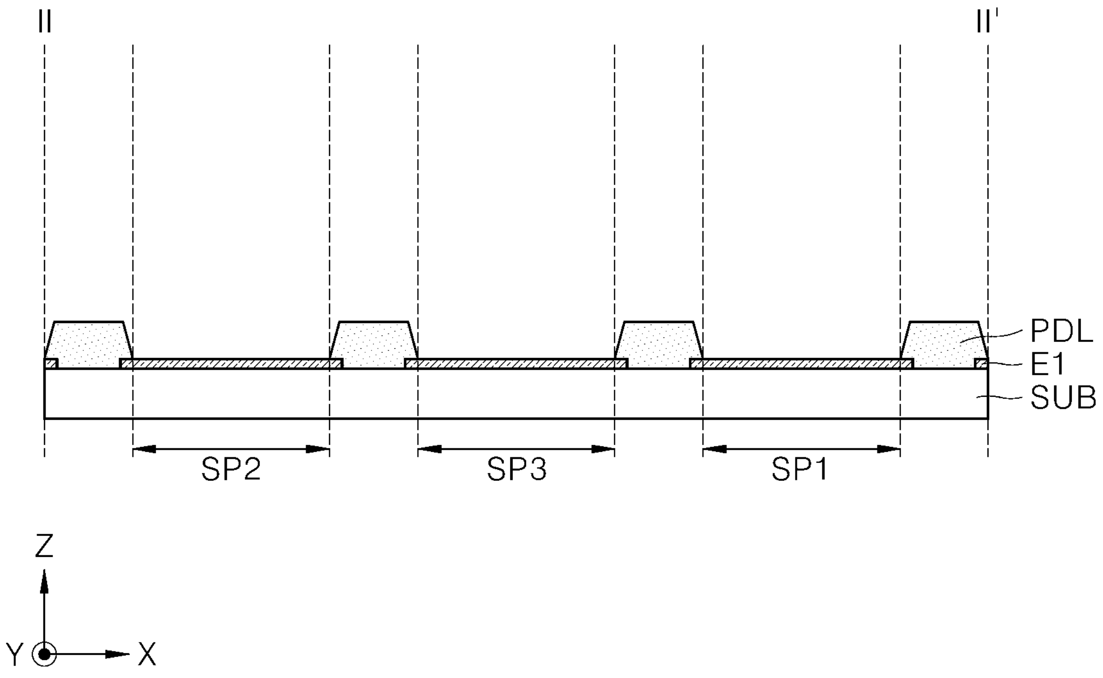

Referring to FIGS. 4A and 4B, a first electrode E1 may be formed on the substrate SUB, and the pixel defining layer PDL may be formed on the first electrode E1 to separate the plurality of sub-pixels SP1, SP2, and SP3 from each other.

The plurality of sub-pixels SP1, SP2, and SP3 may include the first sub-pixel SP1, the second sub-pixel SP2, and the third sub-pixel SP3.

For example, after depositing a first electrode film for forming the first electrode E1 on the substrate SUB, the first electrode film is patterned in a pattern corresponding to the first sub-pixel SP1, the second sub-pixel SP2, and the third sub-pixel SP3 to form the plurality of first electrodes E1.

The pixel defining layer PDL may be formed on the plurality of first electrodes E1 to define the boundaries between the first sub-pixel SP1, the second sub-pixel SP2, and the third sub-pixel SP3.

The pixel defining layer PDL may be disposed to overlap with respective distal ends of the adjacent first electrodes E1 so as to separate the first sub-pixel SP1, the second sub-pixel SP2, and the third sub-pixel SP3 from each other.

Figure 5A:
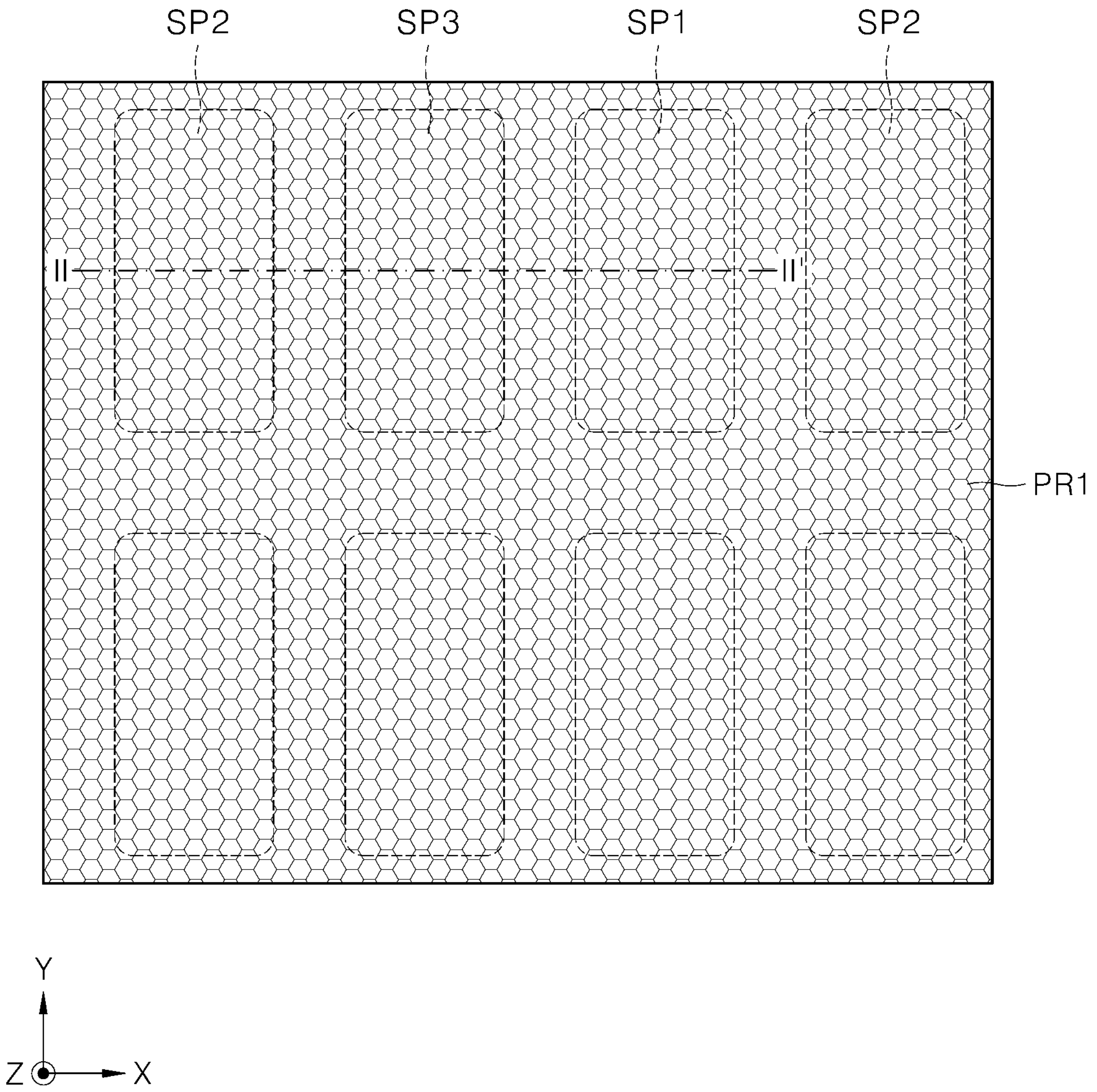
Figure 5B:
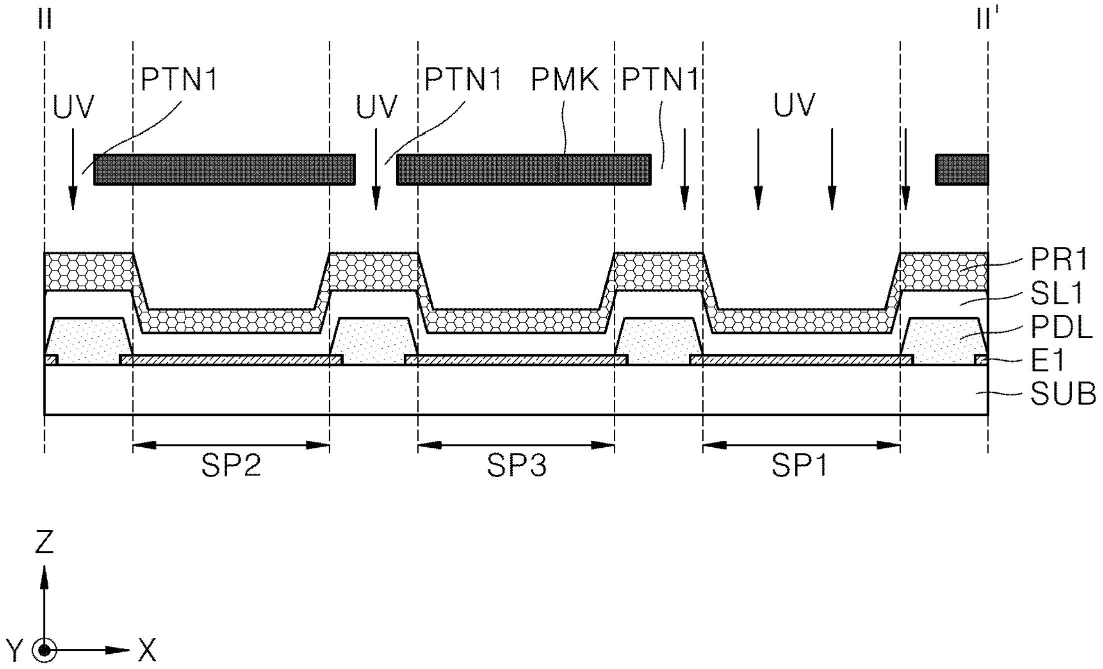

Referring to FIGS. 5A and 5B, a protective film SL and the photoresist film PR may be formed to cover the first electrode E1 and the pixel defining layer PDL.

For example, a first protective film SL1 and a first photoresist film PR1 may be coated to cover the first electrode E1 and the pixel defining layer PDL.

Terms such as first, second, and third defined in the present disclosure do not limit the order of the processes, and such terms only distinguish one component from other components and is used to provide convenience of description.

The first protective film SL1 may be made of the same material as that of a second protective film SL2 and a third protective film SL3 to be described later and may be formed with the same process as that of the second protective film SL2 and the third protective film SL3. In addition, the first photoresist film PR1 may be made of the same material as that of a second photoresist film PR2 and a third photoresist film PR3 to be described later and may be formed with the same process as that of the second photoresist film PR2 and the third photoresist film PR3.

The protective film including the first protective film SL1, the second protective film SL2, and the third protective film SL3 may contain a fluorine-based material.

For example, the protective film may be made of a fluropolymer material containing a large amount of fluorine (F) in a functional group while carbon-carbon bonds are continuously formed in a chain structure (carbon-carbon backbone).

Hereinafter, in [Chemical Formula 1], a chemical structural formula of the fluropolymer material containing a large amount of fluorine (F) in the functional group according to an example of the present disclosure is shown.

[Chemical Formula 1]

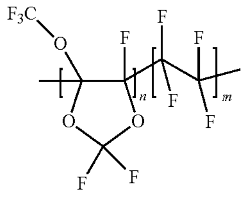

As shown in [Chemical Formula 1], the fluropolymer used as the material of the protective film contains a large amount of fluorine (F) in the functional group.

The fluropolymer containing a large amount of fluorine (F) in the functional group may have orthogonality with respect to the organic matter.

The orthogonality may be understood as a characteristic in which two things exist independently of each other.

Accordingly, the protective film may have both of a hydrophobic characteristic of having a low affinity with water and an oleophobic characteristic of having a low affinity with oil.

Because of such orthogonality, the protective film may block a moisture permeation path with a characteristic of separating or rejecting the moisture.

In addition, because there is little influence from a developer containing an organic solvent used in the process of proceeding the process, a damage to the organic matter caused by the organic solvent can be reduced.

The photomask PMK having a first opening pattern PTN1 is disposed on the first photoresist film PR1, and the exposure process of exposing the first photoresist film PR1 to the ultraviolet ray UV via the photomask PMK having the first opening pattern PTN1 may be performed.

Figure 6A:
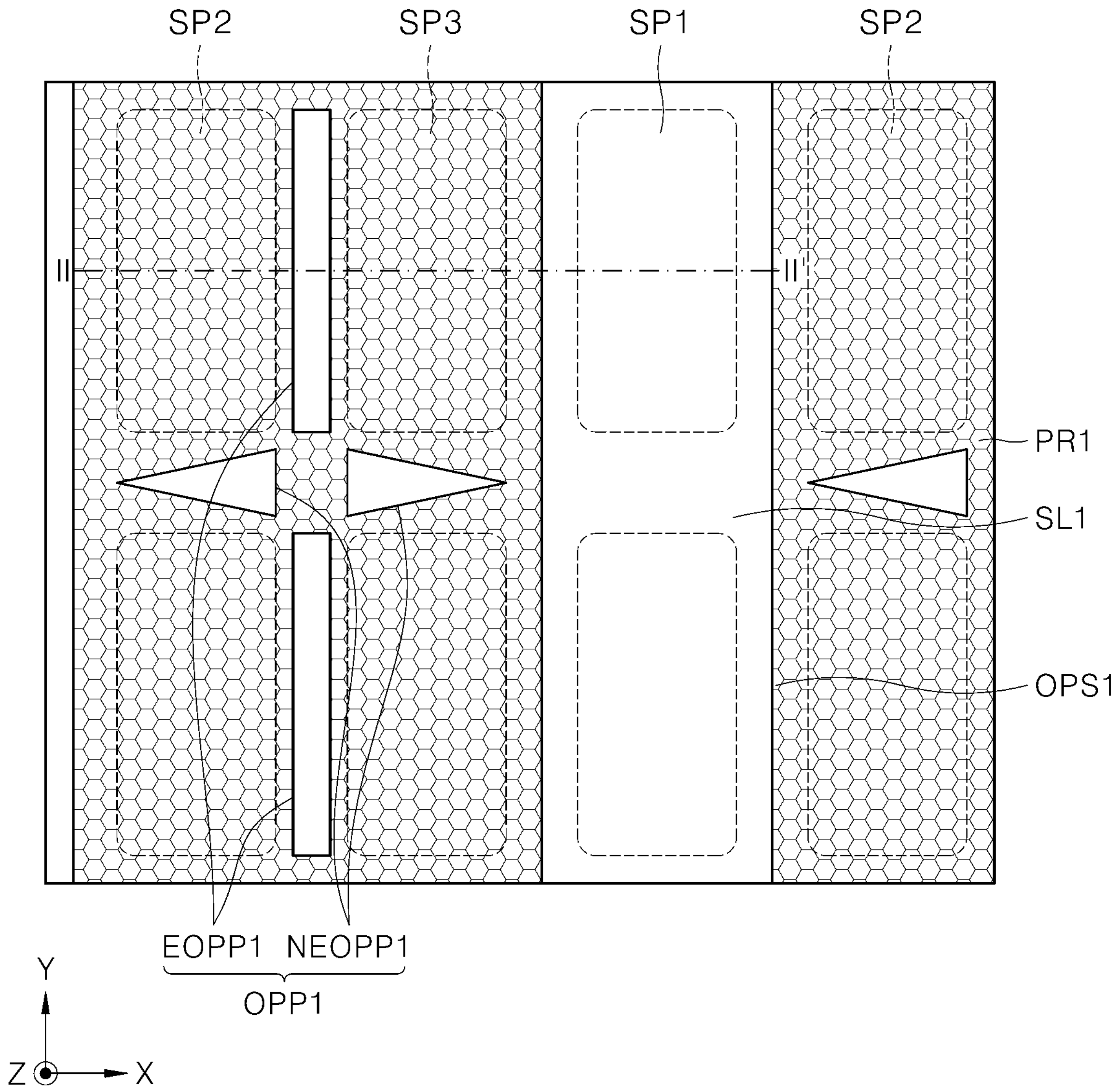
Figure 6B:
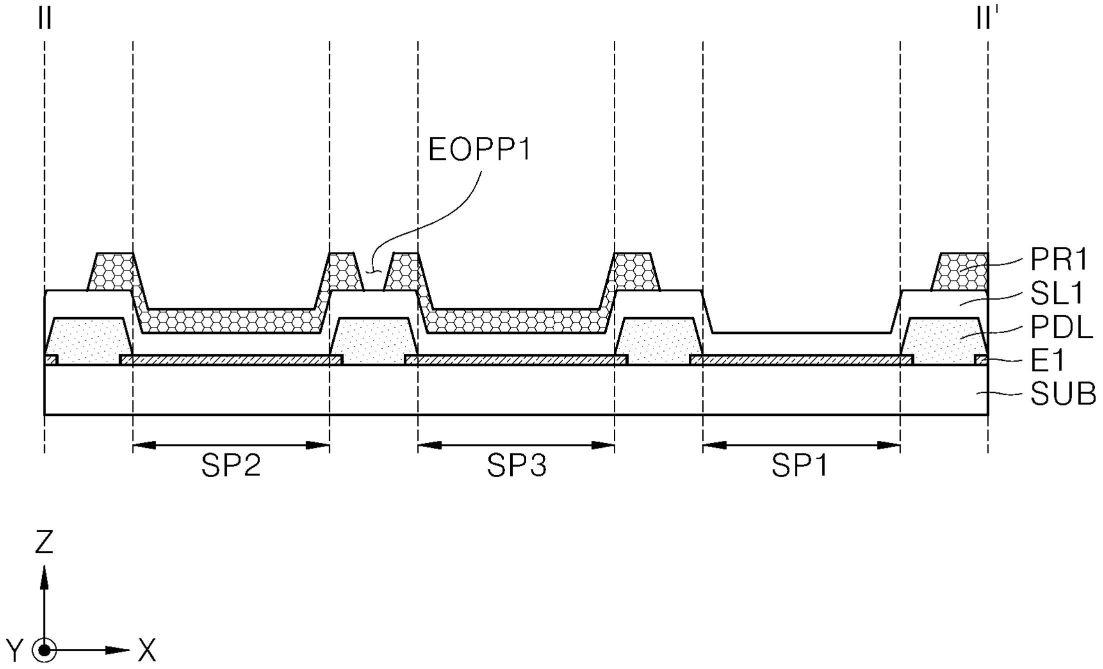

Referring to FIGS. 6A and 6B, the photoresist film PR may be patterned such that an opening pattern for opening one of the plurality of sub-pixels and opening at least some areas on the pixel defining layer PDL between the sub-pixels that are not opened is formed.

For example, as the first photoresist film PR1 exposed by the ultraviolet light is developed with the developer, some areas of the first photoresist film PR1 may be removed to correspond to the first opening pattern PTN1 located in the first sub-pixel SP1 and at least some areas of the pixel defining layer PDL between the second sub-pixel SP2 and the third sub-pixel SP3.

The first opening pattern PTN1 may include a first sub-pixel opening OPS1 that opens the first sub-pixel SP1, and a first pixel defining layer opening OPP1 that opens at least some areas of the pixel defining layer PDL.

The first sub-pixel opening OPS1 may not only completely open the first sub-pixel SP1, but also open a partial area of the pixel defining layer PDL corresponding to a peripheral edge of the first sub-pixel SP1.

For example, referring to FIG. 6A, the first sub-pixels SP1 having the same color may be sequentially arranged adjacent to each other in a first direction.

In addition, in a second direction, the first sub-pixels SP1 having the same color may not be continuously arranged adjacent to each other, but the second sub-pixel SP2 or the third sub-pixel SP3 having the color different from that of the first sub-pixel SP1 may be disposed adjacent to the first sub-pixel SP1.

In one aspect of the present disclosure, the first direction may be a direction in which sub-pixels having the same color are arranged adjacent to each other, and the second direction may be a direction in which sub-pixels having the different colors are arranged adjacent to each other.

Accordingly, in the first sub-pixel opening OPS1, an area corresponding to the pixel defining layer PDL between the adjacent first sub-pixels SP1 may be completely opened in the first direction.

In addition, in the first sub-pixel opening OPS1, in the second direction, the partial area of the pixel defining layer PDL corresponding to the peripheral edge of the first sub-pixel SP1 may be opened, but some areas of the pixel defining layer PDL respectively corresponding to peripheral edges of the second sub-pixel SP2 and the third sub-pixel SP3 adjacent to the first sub-pixel SP1 may not be opened.

For example, the first sub-pixel opening OPS1 may be opened up to a half area of the pixel defining layer PDL between the first sub-pixel SP1 and the third sub-pixel SP3 adjacent to each other, and up to a half area of the pixel defining layer PDL between the first sub-pixel SP1 and the second sub-pixel SP2.

The first pixel defining layer opening OPP1 may open the at least some areas of the pixel defining layer PDL.

For example, the first pixel defining layer opening OPP1 may be defined to correspond to at least one of central portions of the pixel defining layer PDL disposed between the second sub-pixel SP2 and the third sub-pixel SP3 adjacent to each other, between the second sub-pixel SP2 and the second sub-pixel SP2 adjacent to each other, and between the third sub-pixel SP3 and the third sub-pixel SP3 adjacent to each other, excluding the first sub-pixel SP1.

Accordingly, the first pixel defining layer opening OPP1 may be disposed in a form of an island that does not overlap with the first sub-pixel SP1, the second sub-pixel SP2, and the third sub-pixel SP3.

The first pixel defining layer opening OPP1 may include at least one of a first constant-spacing pixel defining layer opening EOPP1 and a first varying-spacing pixel defining layer opening NEOPP1.

The first constant-spacing pixel defining layer opening EOPP1 may be spaced apart from boundaries of the second sub-pixel SP2 and the third sub-pixel SP3 adjacent to each other so as to have an equal width.

The term ‘constant-spacing’ described in the present disclosure means that a spacing between a boundary of the constant-spacing pixel defining layer opening and a boundary of an adjacent sub-pixel is constantly maintained.

Therefore, referring to FIG. 6A, the first constant-spacing pixel defining layer opening EOPP1 may be defined in a bar shape and may be spaced apart from the boundaries of the second sub-pixel SP2 and the third sub-pixel SP3 adjacent thereto so as to have the equal width.

However, the shape of the first constant-spacing pixel defining layer opening EOPP1 may not be limited to the bar shape and may be changed based on a shape of the adjacent sub-pixels. Therefore, the first constant-spacing pixel defining layer opening EOPP1 may have various shapes such as a circular shape, a curved shape, and the like.

Each first varying-spacing pixel defining layer opening NEOPP1 may be spaced apart from the boundary of each of the second sub-pixel SP2 and the third sub-pixel SP3 adjacent thereto so as to have an increasing or decreasing width.

The term ‘varying-spacing’ described in the present disclosure means that the spacing between the boundary of the varying-spacing pixel defining layer opening and the boundary of the adjacent sub-pixel is not constantly maintained, but increases in one direction, decreases in one direction, or increases/decreases in one direction.

Therefore, referring to FIG. 6A, each first varying-spacing pixel defining layer opening NEOPP1 may be defined in a triangular shape, and may be spaced apart from the boundary of each of the second sub-pixel SP2 and the third sub-pixel SP3 adjacent thereto so as to have a width increasing or decreasing in the second direction.

However, the shape of the first varying-spacing pixel defining layer opening NEOPP1 may not be limited to the triangular shape and may be changed based on the shape of the adjacent sub-pixel. Therefore, the first varying-spacing pixel defining layer opening NEOPP1 may have various shapes such as a trapezoidal shape, a sandglass shape, and the like.

As such, because the first photoresist film PR1 is patterned in the pattern corresponding to the first opening pattern PTN1, the first protective film SL1 disposed beneath the first photoresist film PR1 may be exposed to the outside in the pattern corresponding to the first opening pattern PTN1.

Because the first protective film SL1 containing the fluorine-based material having the orthogonality with respect to the organic matter is already formed before the first photoresist film PR1 is formed, the damage to the light emitting layer containing the organic matter by the photoresist solution and the developer may be reduced.

For example, because the forming process and the removing process of the photoresist film and the protective film may be repeated several times in the process of forming the sub-pixel having the different colors, it is necessary to reduce an effect on the second light emitting layer EM2 and the third light emitting layer EM3 that are stacked in a subsequent process after the development of the first photoresist film PR1.

Figure 7A:
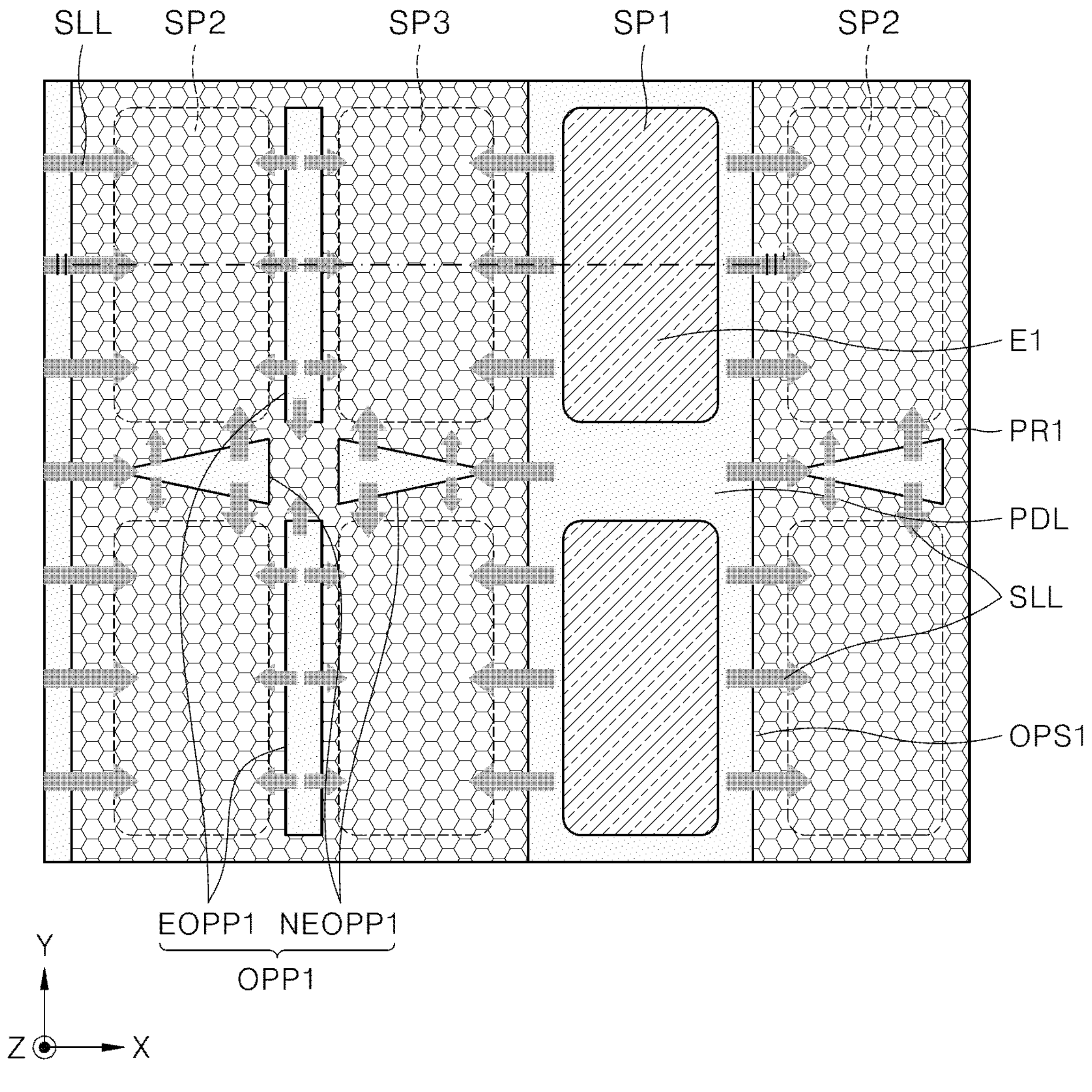
Figure 7B:
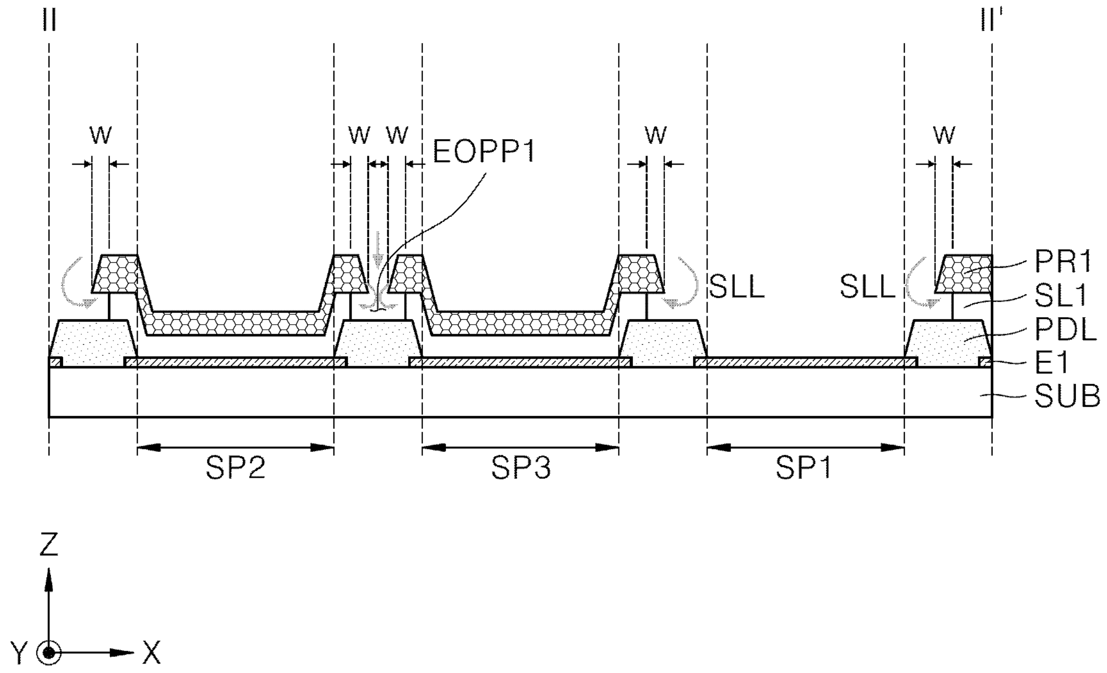

Referring to FIGS. 7A and 7B, some areas of the first protective film SL1 corresponding to the first opening pattern PTN1 may be removed by developing the first protective film SL1 exposed to the outside in the pattern corresponding to the first opening pattern PTN1 using the developer.

The developer used for the development of the first protective film SL1 may be a fluorine-based solution (SLL).

The fluorine-based solution (SLL) may be well put into a small gap of a μm unit to be developed because of a very low surface tension thereof, and may be easily removed even after the process because of a strong volatility.

When the first protective film SL1 containing the fluorine-based material is developed with the fluorine-based solution (SLL), not only the some areas of the first protective film SL1 exposed to the first opening pattern PTN1 may be removed, but also an undercut structure that is introduced inwardly of the first opening pattern PTN1 by a predetermined distance w may be formed.

Therefore, a distal end of the first photoresist film PR1 may protrude outwardly of the first protective film SL1 by the predetermined distance w, and the first protective film SL1 may have the undercut structure of being introduced inwardly of the distal end of the first photoresist film PR1 by the predetermined distance w.

Because the first protective film SL1 has the undercut structure, in a process to be described later, an input of the developer for lift-off used in the process of stripping off the remaining first protective film SL1 may become smoother.

As such, in order to deposit the light emitting layer after the development of the first photoresist film PR1, the first protective film SL1 may be developed with the fluorine-based solution (SLL) to open an area where the light emitting layer may be deposited.

In this case, because the fluorine-based solution (SLL) used as the developer has the orthogonality with the light emitting layer containing the organic matter, the light emitting layer may not be damaged by the fluorine-based solution (SLL).

For example, because the forming process and the removing process of the photoresist film and the protective film may be repeated several times in the process of forming the sub-pixel having the different colors, it is necessary to reduce the effect on the second light emitting layer EM2 and the third light emitting layer EM3 that are stacked in the subsequent process after the development of the first protective film SL1.

Figure 8A:
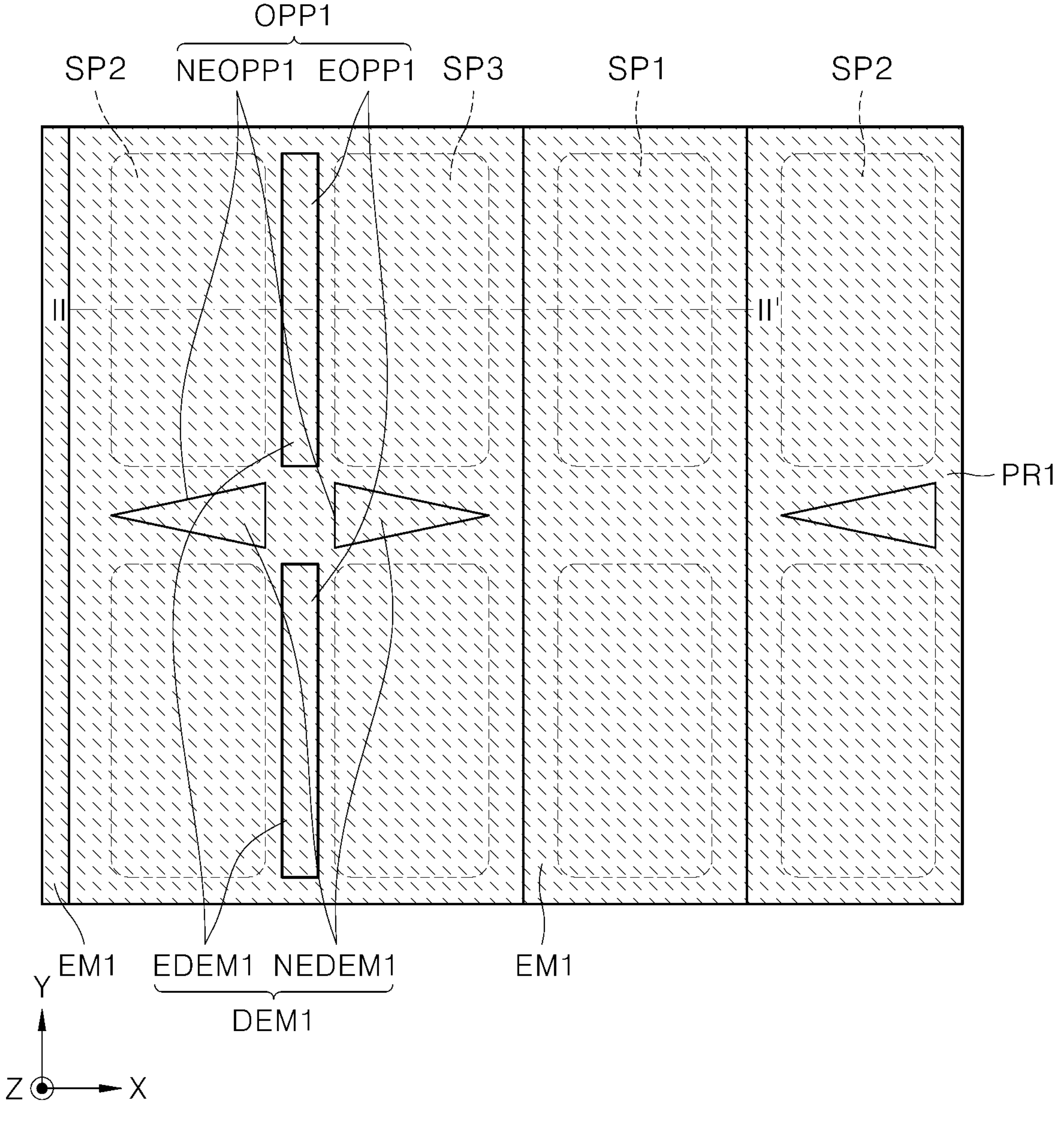
Figure 8B:
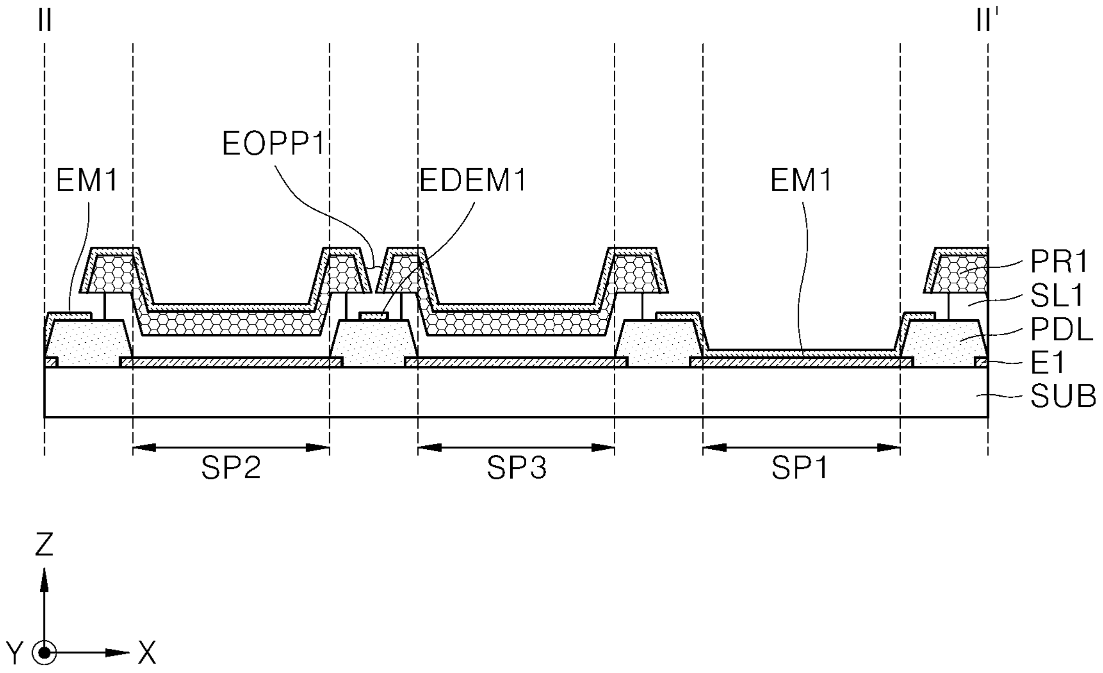

Referring to FIGS. 8A and 8B, a light emitting layer and a dummy light emitting layer corresponding to the opening pattern may be formed by being deposited.

For example, the first light emitting layer EM1 and a first dummy light emitting layer DEM1 may be formed in a pattern corresponding to the first opening pattern PTN1 by a deposition process using thermal evaporation.

Because the first opening pattern PTN1 is open, the first light emitting layer EM1 may be formed in an area corresponding to the first sub-pixel SP1, and the first dummy light emitting layer DEM1 may be formed in areas corresponding to some areas of the pixel defining layer PDL.

The first dummy light emitting layer DEM1 may include a first constant-spacing dummy light emitting layer EDEM1 and a first varying-spacing dummy light emitting layer NEDEM1.

The first dummy light emitting layer DEM1 may be formed in a pattern corresponding to the first pixel defining layer opening OPP1.

Thus, the first constant-spacing dummy light emitting layer EDEM1 and the first varying-spacing dummy light emitting layer NEDEM1 may be respectively formed in patterns corresponding to the first constant-spacing pixel defining layer opening EOPP1 and the first varying-spacing pixel defining layer opening NEOPP1.

For example, the first constant-spacing dummy light emitting layers EDEM1 may be arranged along the first direction in which the second sub-pixels SP2 or the third sub-pixels SP3 having the same color are arranged adjacent to each other.

For example, the first varying-spacing dummy light emitting layers NEDEM1 may be arranged along the second direction in which the second sub-pixel SP2 and the third sub-pixel SP3 having the different colors are arranged adjacent to each other.

A residual light emitting layer may be formed on the first photoresist film PR1.

Figure 9A:
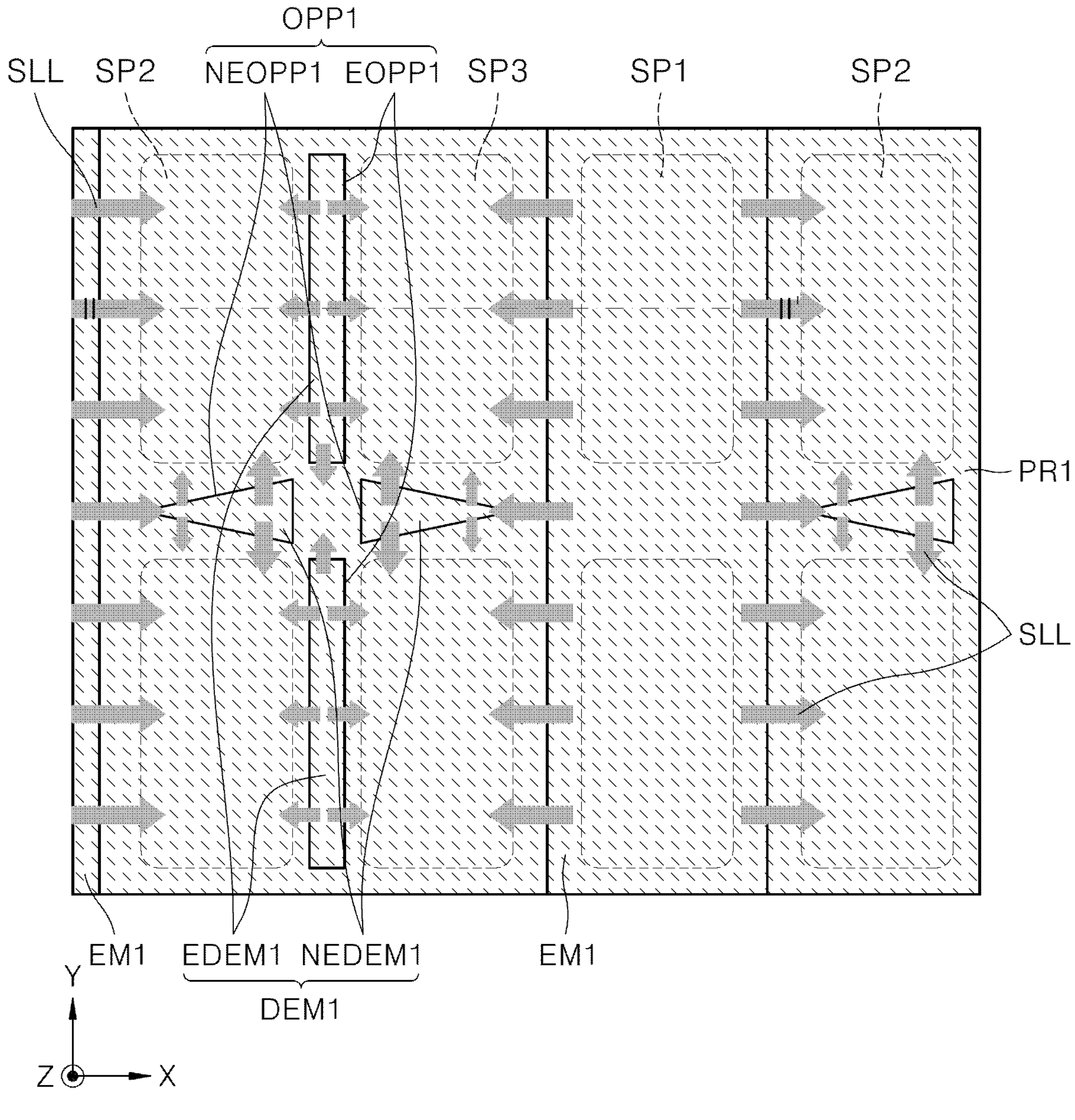
Figure 9B:
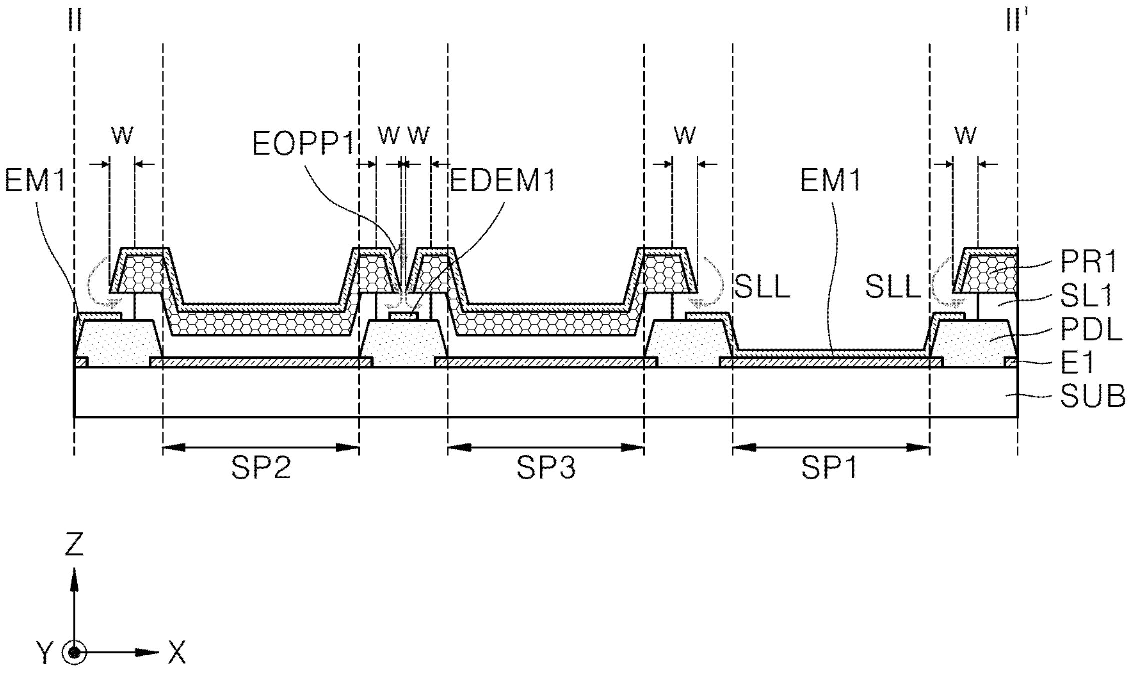

Referring to FIGS. 9A and 9B, the photoresist film and the protective film may be stripped off.

For example, the first protective film SL1 disposed beneath the first photoresist film PR1 may be dissolved by injecting the fluorine-based solution (SLL) as the developer on the substrate SUB.

When dissolving the first protective film SL1 as such, the first photoresist film PR1 and the residual light emitting layer remaining on the first protective film SL1 may also be removed by being stripped off in the lift-off manner at once.

In this case, the undercut structure of the first protective film SL1 may make the injection of the fluorine-based solution (SLL) for the lift-off more smoothly, so that ease of the lift-off may be increased.

In a reaction between a solid and a liquid, a surface area of the solid is one of factors affecting a dissolution speed along with a process temperature and a process pressure.

Therefore, the larger the surface area, the higher the dissolution speed because a contact area between the solvent and the solid increases. Such phenomenon may be described with the Noyes-Whitney formula.

Figure 15:
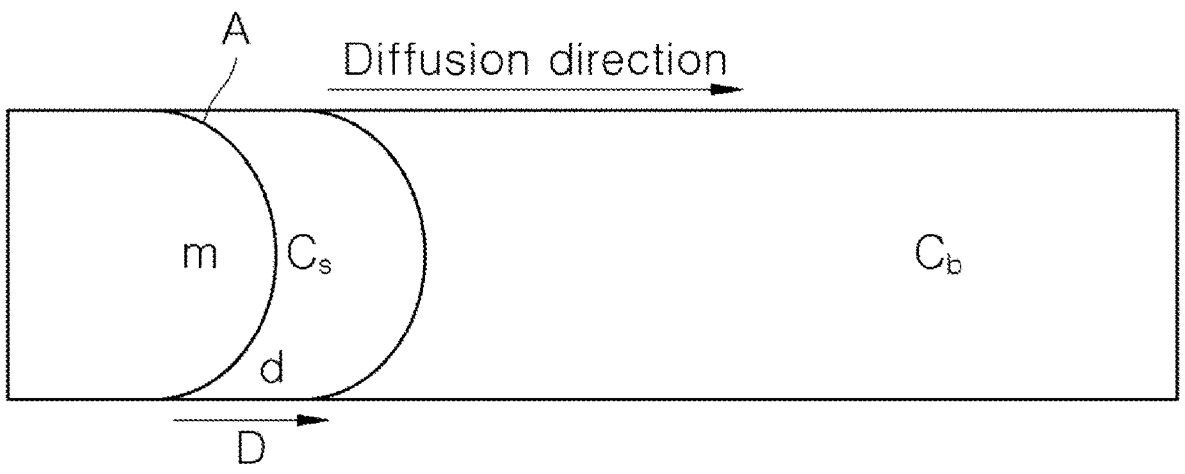
FIG. 15 is for illustrating the Noyes-Whitney formula for illustrating a dissolution speed of a solid in a reaction between the solid and a liquid.

FIG. 15 is a diagram for illustrating the Noyes-Whitney formula.

$$dm/dt=A\ D/d(C\_s-C\_b) \qquad \text{Noyes-Whitney formula,}$$

In this case, m is a mass of the dissolved solid, dm/dt is the dissolution speed (kg/s), d is a concentration changing section (m), A is the surface area (m2), D is a diffusion coefficient (m/s), Cs is a solubility in a diffusion layer, and Cb is a bulk solvent concentration (mg/mL). Cs=Cb means that the polymer in the solvent has reached a saturation concentration.

For example, in a small and medium-sized display panel, a size of one sub-pixel is several to several tens of μm. Therefore, when the protective film having the undercut structure is developed with the lift-off solution, it may take 1 to 2 minutes at the shortest and 10 to 20 minutes at the longest.

However, in a large display panel having a large area, the size of one sub-pixel is several hundred μm. Therefore, a volume of the protective film to be dissolved is increased several tens to hundreds of times compared to the small and medium-sized display panel.

When this is applied to the Noyes-Whitney formula, the lift-off process time of the large display panel having the large area may be greatly increased to 1 day or longer.

As a result, increasing the physical contact area between the lift-off solution and the protective film may be very beneficial to shortening the process time and forming a uniform strip result.

Accordingly, according to an aspect of the present disclosure, the fluorine-based solution SLL may be injected also into the first pixel defining layer opening OPP1, which is the open area on the pixel defining layer PDL, so that a dissolution time for the first protective film SL1 applied to the unopened second sub-pixel SP2 and third sub-pixel SP3 may be greatly shortened.

Figure 14A:
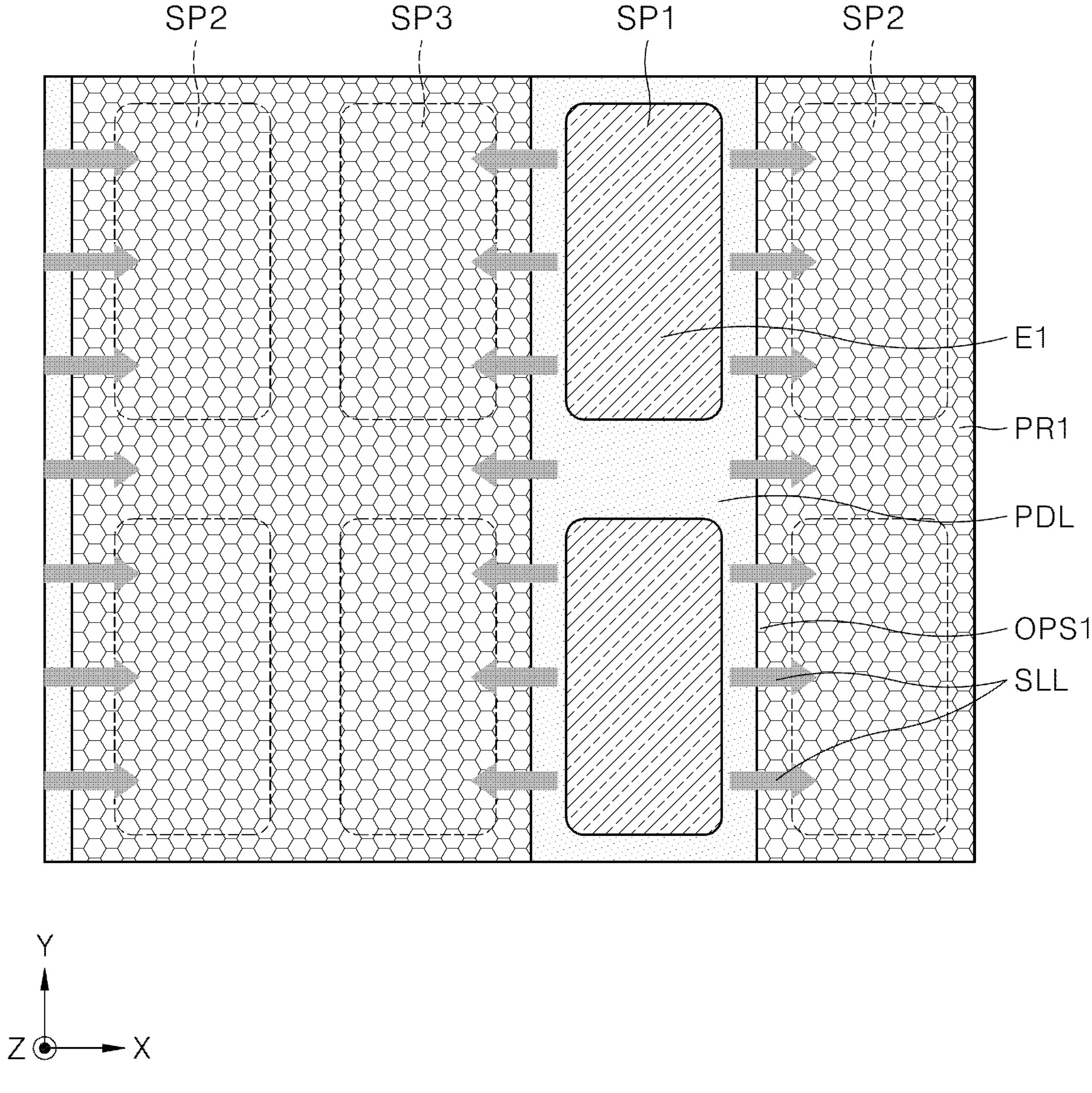
FIGS. 14A and 14B respectively show Comparative Example and Example based on presence or absence of an opening pattern on a pixel defining layer in a process of stripping off a protective film and a photoresist film.

FIG. 14A is Comparative Example showing an injection direction and an injected amount of the fluorine-based solution (SLL) when the fluorine-based solution (SLL) is injected into the first protective film including only the first sub-pixel opening OPS1, and (b) in FIG. 14 is Example showing an injection direction and an injected amount of the fluorine-based solution (SLL) when the fluorine-based solution (SLL) is injected into the first protective film including the first pixel defining layer opening OPP1 in addition to the first sub-pixel opening OPS1.

In this case, a direction of an arrow may mean the injection direction of the fluorine-based solution (SLL), and a size of the arrow may mean the injected amount of the fluorine-based solution (SLL).

Referring to FIG. 14A, the fluorine-based solution (SLL) may be injected only through the first sub-pixel opening OPS1, thus an area adjacent to the first sub-pixel opening OPS1 may be dissolved quickly, but areas between the second sub-pixel SP2 and the third sub-pixel SP3 where there is no open area into which the fluorine-based solution (SLL) may be injected may be dissolved very slowly.

Therefore, according to Comparative Example, because the dissolution speed differs for each area due to an area difference of the open areas, as well as uniformity of the dissolution of the areas is low, not only the time of the stripping process may be greatly increased, but also the uniformity of the stripping process may be degraded.

Figure 14B:
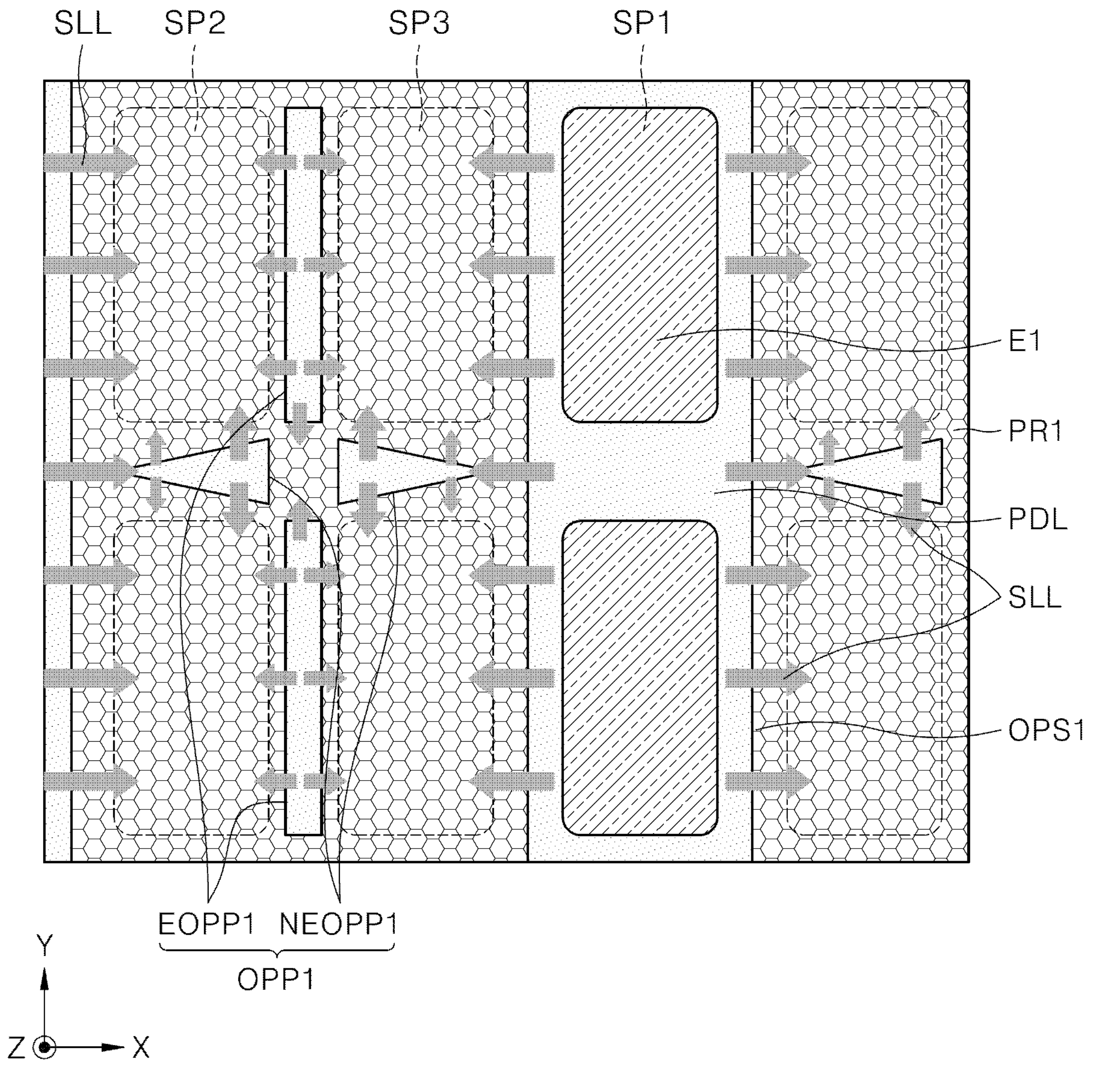

On the other hand, referring to FIG. 14B, because the fluorine-based solution (SLL) may be injected not only through the first sub-pixel opening OPS1 but also through the first pixel defining layer opening OPP1, the difference in the dissolution speed of the areas that may occur due to the difference in the area of the open area may be compensated for.

That is, according to Example of the present disclosure, because the first protective film SL1 disposed beneath the first photoresist film PR1 increases the surface area exposed to the fluorine-based solution (SLL), which is the strip solution, the stripping time may be shortened, and at the same time, the uniformity of the stripping process may be improved.

According to Example of the present disclosure, the first pixel defining layer opening OPP1 may include at least one of the first constant-spacing pixel defining layer opening EOPP1 and the first varying-spacing pixel defining layer opening NEOPP1.

In Example of the present disclosure, the first constant-spacing pixel defining layer opening EOPP1 and the first varying-spacing pixel defining layer opening NEOPP1 are shown as being arranged in the first direction and the second direction, respectively, but the present disclosure is not limited thereto. Whether the first constant-spacing pixel defining layer opening EOPP1 and the first varying-spacing pixel defining layer opening NEOPP1 are selected or an arrangement shape of the openings may vary depending on the sub-pixel being designed.

The first constant-spacing pixel defining layer opening EOPP1 may be defined between the second sub-pixel SP2 and the third sub-pixel SP3 adjacent to each other to be spaced apart therefrom at an equal spacing, so that the fluorine-based solution (SLL) may be evenly injected in the directions of the second sub-pixel SP2 and the third sub-pixel SP3.

In one example, because a large amount of fluorine-based solution (SLL) may be injected into the area close to the first sub-pixel opening OPS1, it is necessary to decrease an additional injection of the fluorine-based solution (SLL) in the area close to the first sub-pixel opening OPS1, and increase the additional injection of the fluorine-based solution (SLL) in an area far from the first sub-pixel opening OPS1.

Therefore, the first varying-spacing pixel defining layer opening NEOPP1 may be defined in a pattern in which the exposed area of the first protective film SL1 decreases as a distance from the first sub-pixel opening OPS1 decreases and the exposed area of the first protective film SL1 increases as the distance from the first sub-pixel opening OPS1 increases.

Accordingly, the first varying-spacing pixel defining layer opening NEOPP1 may have a triangular shape whose spacing from the adjacent second sub-pixel SP2 or third sub-pixel SP3 increases as the distance from the first sub-pixel opening OPS1 decreases and whose spacing from the adjacent second sub-pixel SP2 or third sub-pixel SP3 decreases as the distance from the first sub-pixel opening OPS1 increases.

Because the first varying-spacing pixel defining layer opening NEOPP1 adjacent to the second sub-pixel SP2 and the first varying-spacing pixel defining layer opening NEOPP1 adjacent to the third sub-pixel SP3 are arranged in a shape in which one sides of the respective triangles face each other, even in the area far apart from the first sub-pixel opening OPS1, the fluorine-based solution (SLL) may be evenly injected compared to the entire area.

Figure 10A:
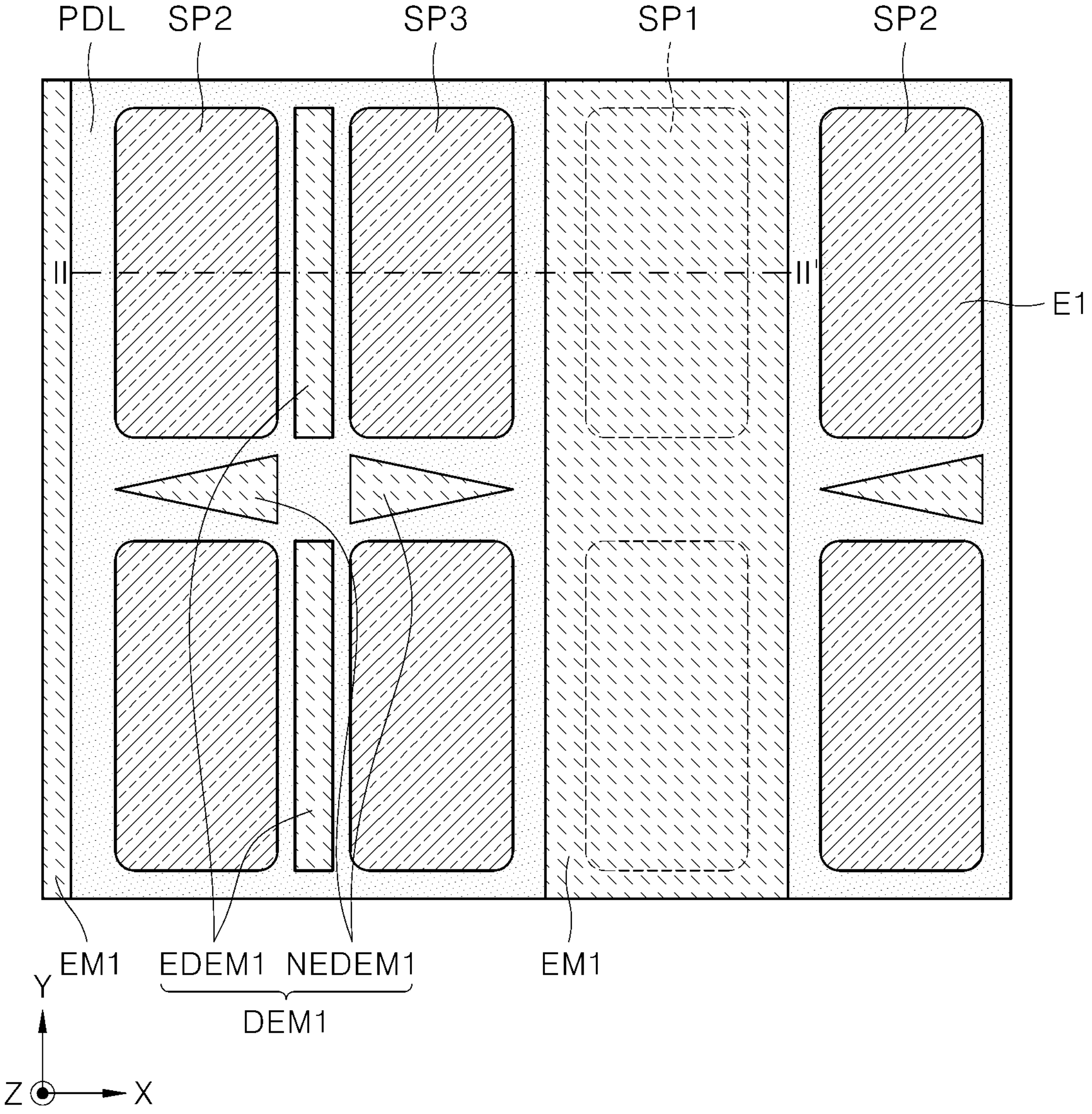
Figure 10B:
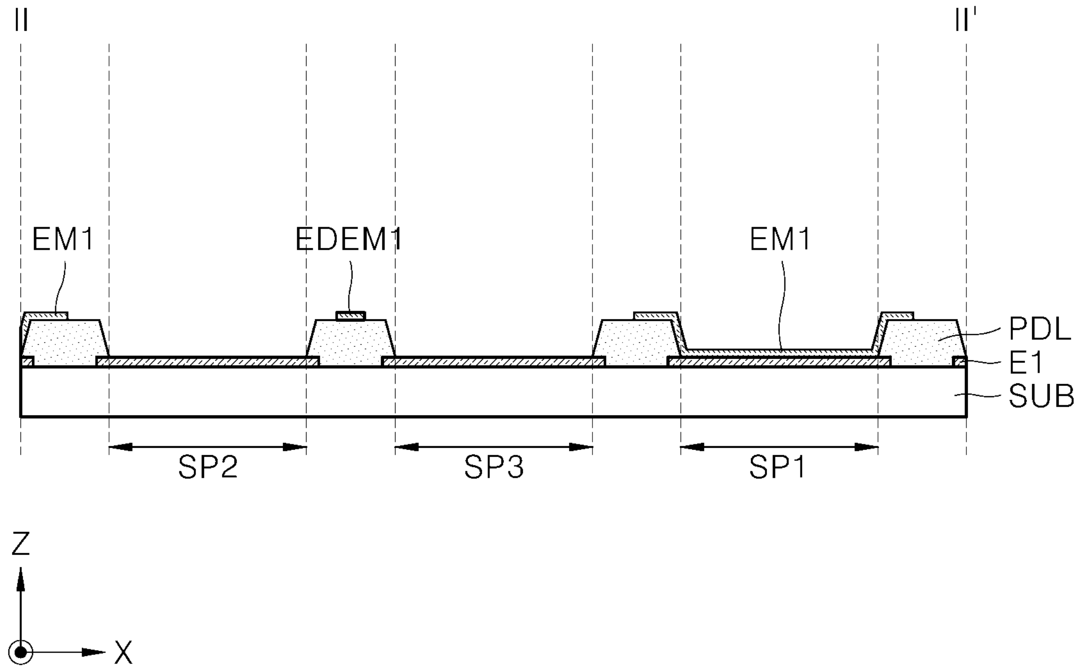

Referring to FIGS. 10A and 10B, it is shown that the light emitting layer and the dummy light emitting layer are formed after the photoresist film and the protective film are stripped off.

After the first photoresist film PR1 and the first protective film SL1 are stripped off due to the lift-off of the first protective film SL1, the first light emitting layer EM1 may be formed in the open area of the first sub-pixel SP1 and the first dummy light emitting layer DEM1 may be formed in some open areas of the pixel defining layer PDL.

Accordingly, the red first light emitting layer EM1 may be formed in the first sub-pixel SP1 realizing the red color.

The forming of the photoresist film and the protective film to the stripping off the photoresist film and the protective film described above may be repeated as many as the number of colors constituting the plurality of sub-pixels.

Accordingly, the green second light emitting layer EM2 of the second sub-pixel SP2 realizing the green color and the blue third light emitting layer EM3 of the third sub-pixel SP3 realizing the blue color may be formed by repeating the process the same as the process of forming the first light emitting layer EM1 of the first sub-pixel SP1.

Figure 11A:
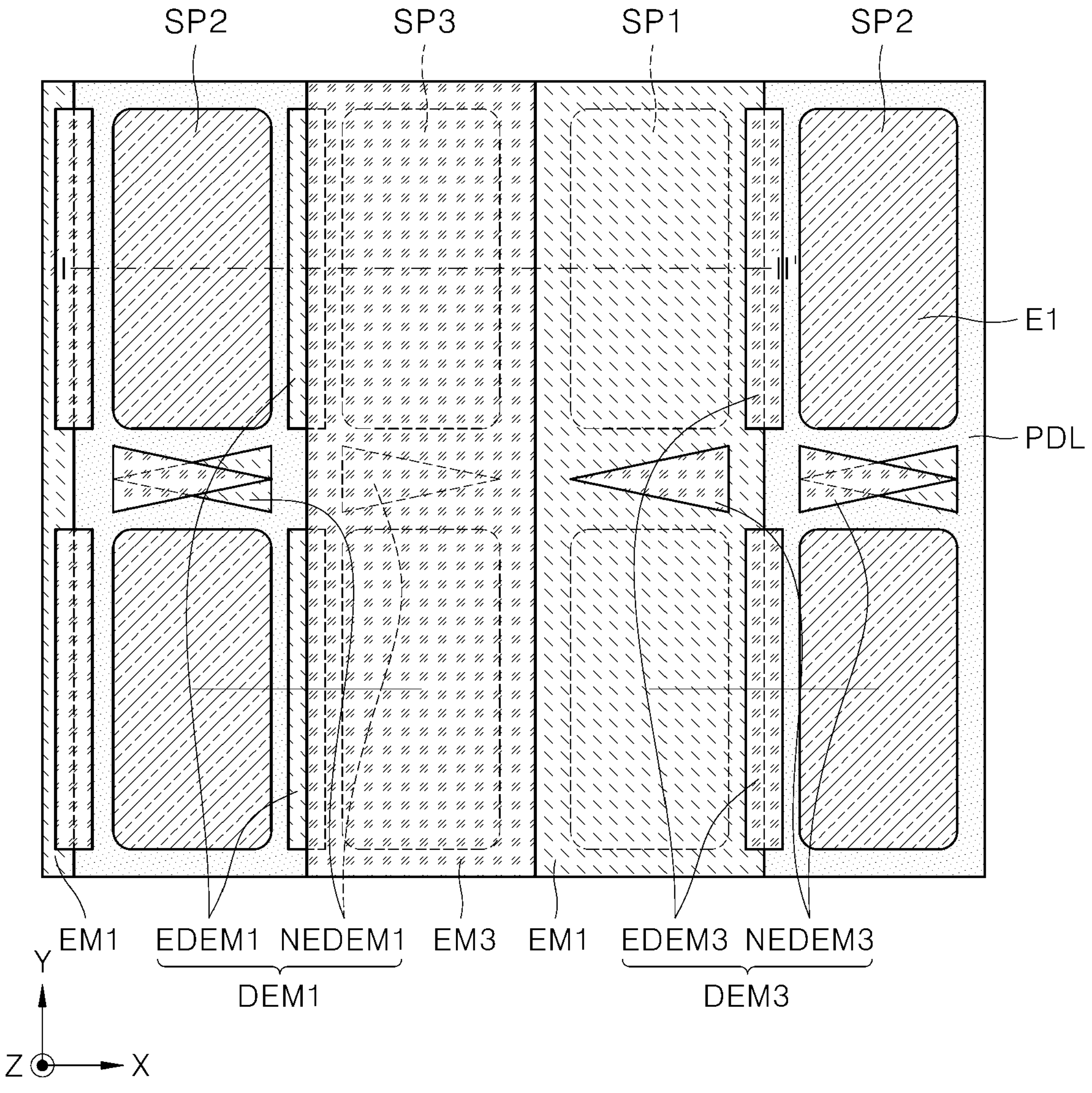
Figure 11B:
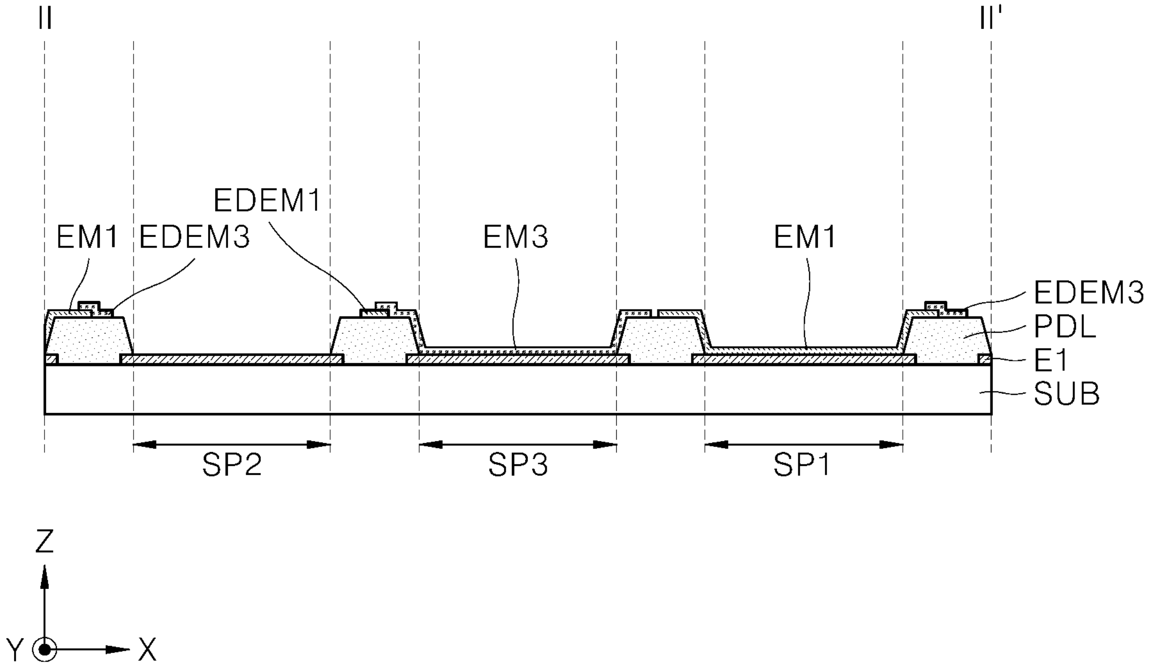

Referring to FIGS. 11A and 11B, after the stripping off the first photoresist film PR1 and the first protective film SL1, the third light emitting layer EM3 and a third dummy light emitting layer DEM3 may be formed in a manufacturing method including forming a third protective film SL3 and a third photoresist film PR3 to cover the first electrode E1, the pixel defining layer PDL, the first light emitting layer EM1, and the first dummy light emitting layer DEM1, patterning the third photoresist film PR3 and the third protective film SL3 such that a third opening pattern PTN3 corresponding to the third sub-pixel SP3 and at least some areas of the pixel defining layer PDL between the first sub-pixel SP1 and the second sub-pixel SP2 is formed, forming the third light emitting layer EM3 and a third dummy light emitting layer DEM3 corresponding to the third opening pattern PTN3, and stripping off the third photoresist film PR3 and the third protective film SL3.

In this case, the third opening pattern PTN3 may include a third sub-pixel opening OPS3 that opens the third sub-pixel SP3, and a third pixel defining layer opening OPP3 that opens at least some areas of the pixel defining layer PDL.

The third pixel defining layer opening OPP3 may include at least one of a third constant-spacing pixel defining layer opening EOPP3 and a third varying-spacing pixel defining layer opening NEOPP3.

The third constant-spacing pixel defining layer opening EOPP3 may be spaced apart from boundaries of the first sub-pixel SP1 and the second sub-pixel SP2 so as to have an equal spacing, and each third varying-spacing pixel defining layer opening NEOPP3 may be spaced apart from the boundary of each of the first sub-pixel SP1 and the second sub-pixel SP2 so as to have a width increasing or decreasing.

Figure 12A:
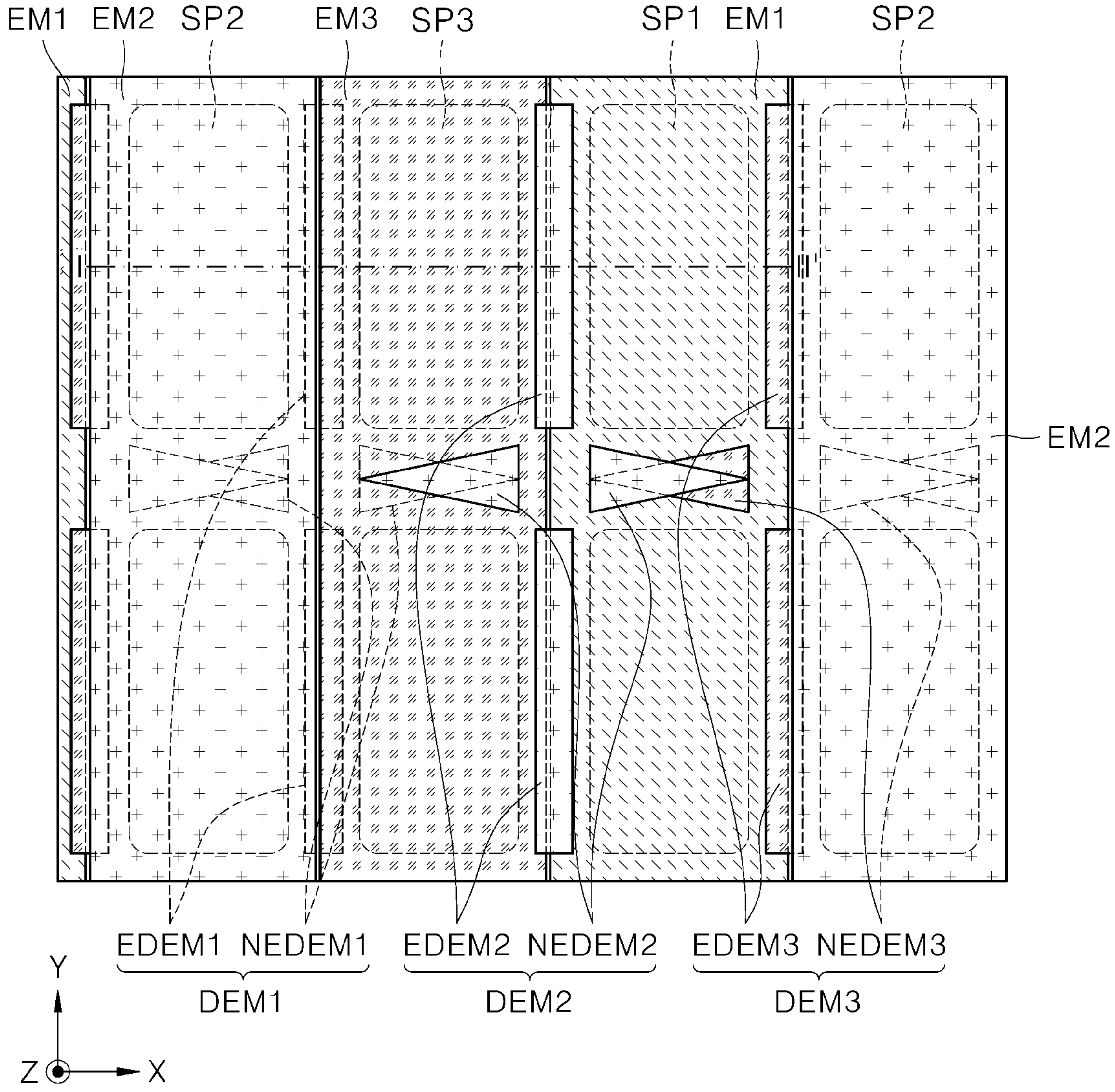
Figure 12B:
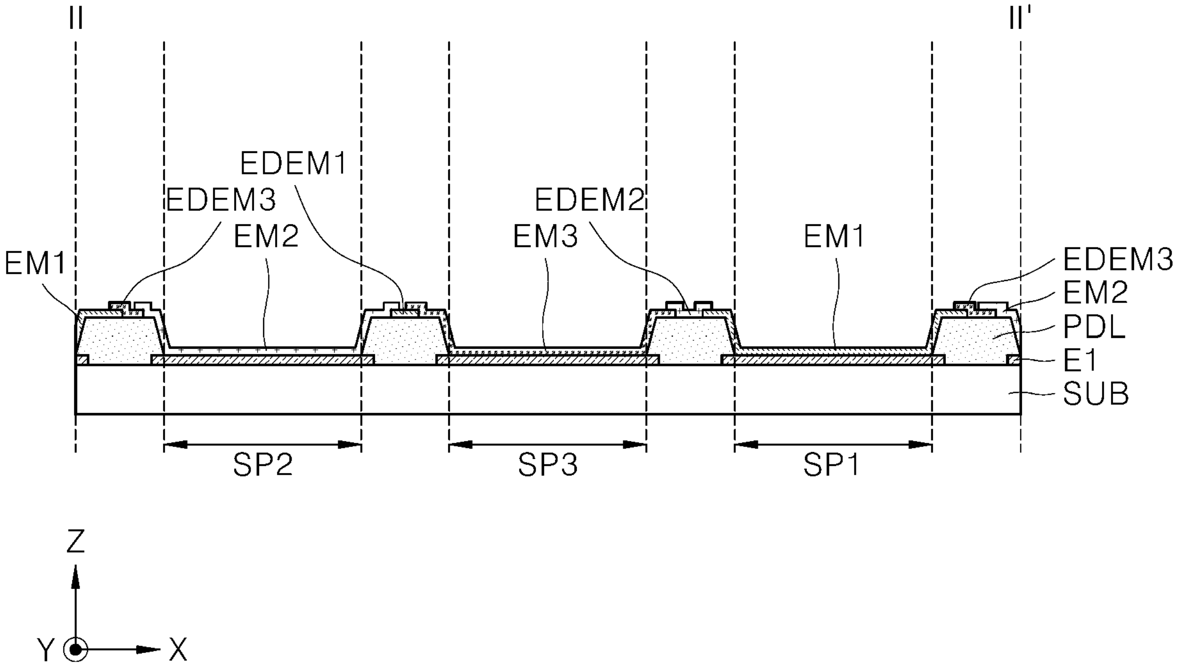
Figure 13A:
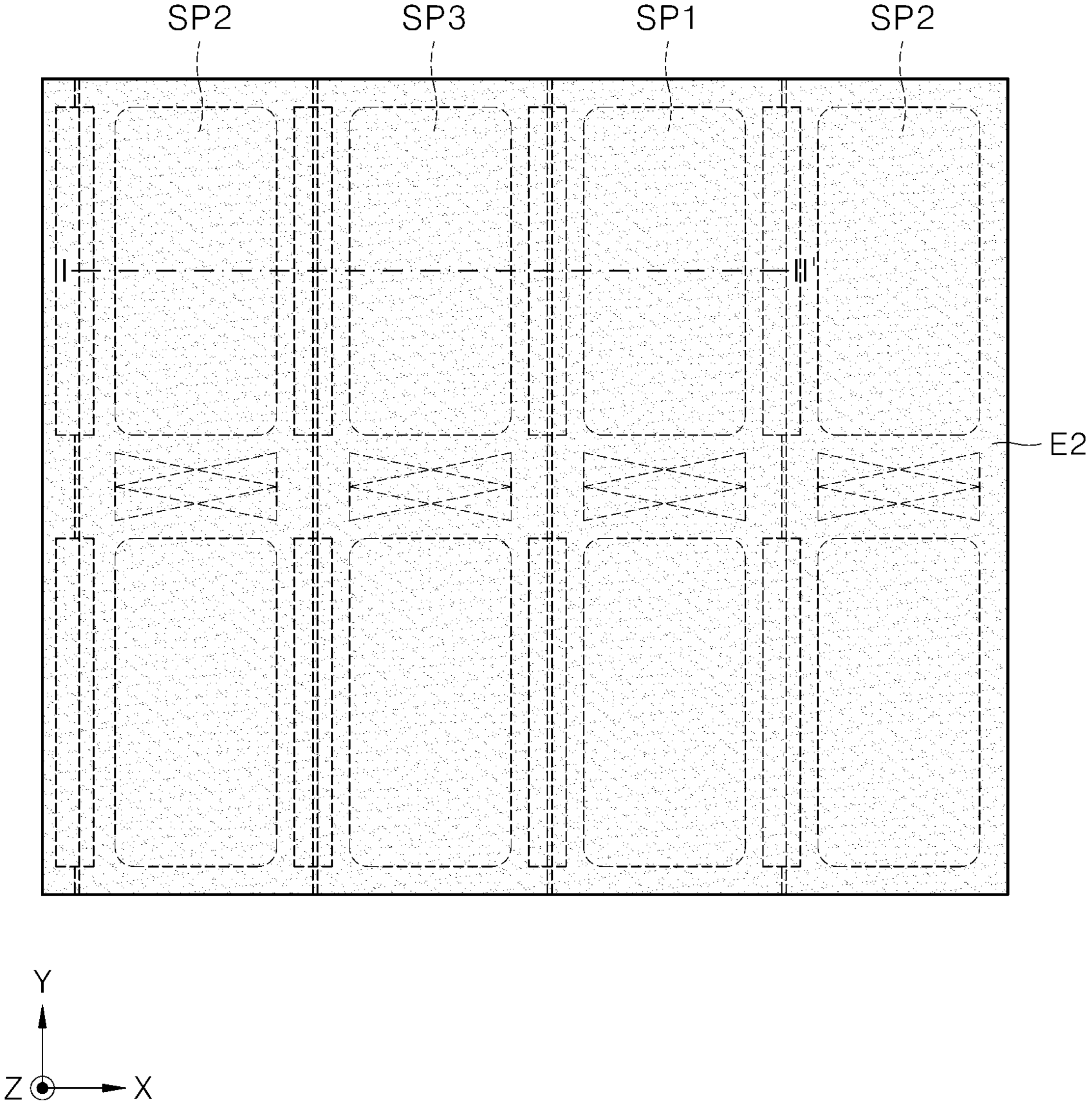
Figure 13B:
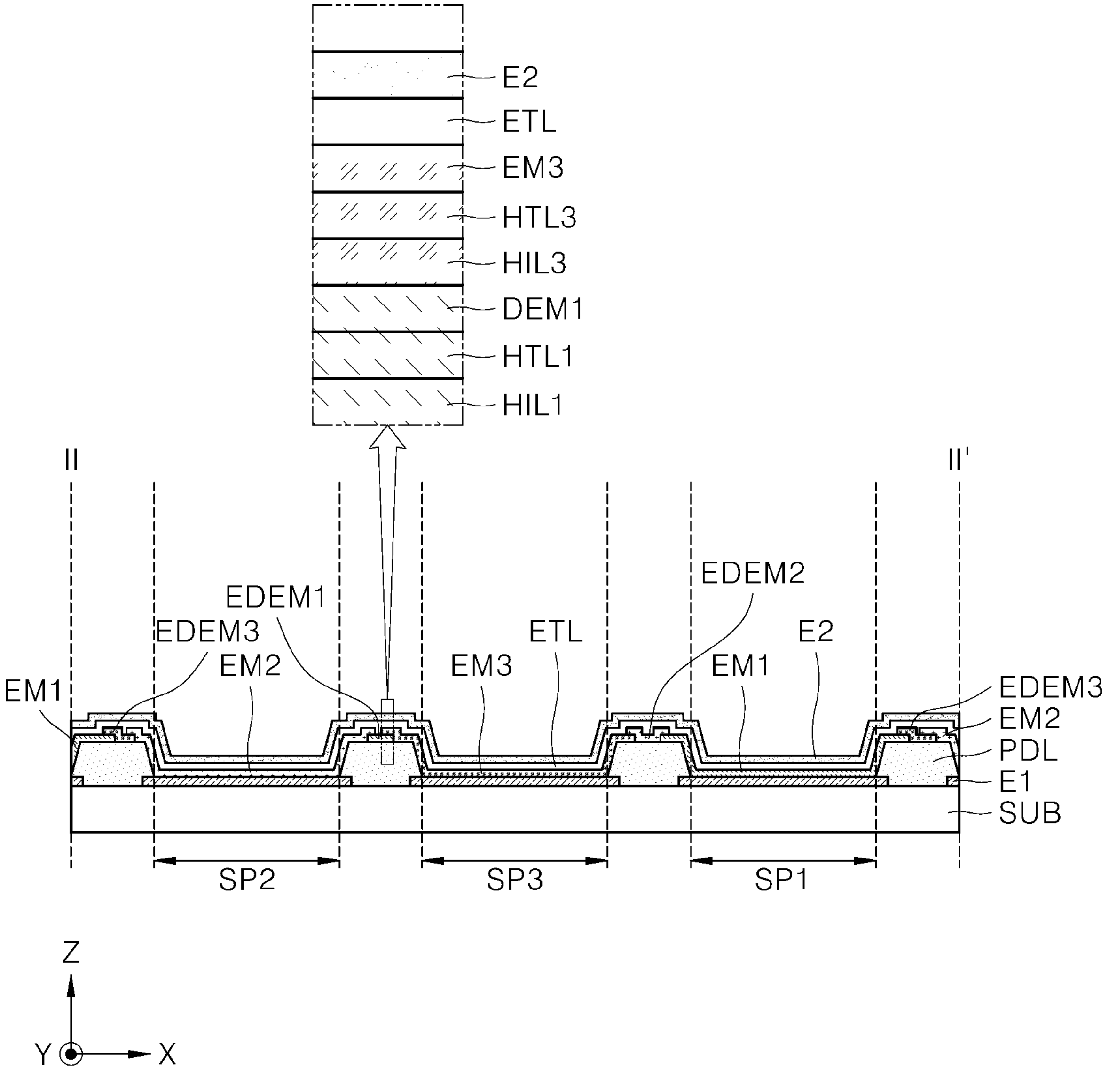

Referring to FIGS. 12A and 12B, after the stripping off the third photoresist film PR3 and the third protective film SL3, the second light emitting layer EM2 and a second dummy light emitting layer DEM2 may be formed in a manufacturing method including forming a second protective film SL2 and a second photoresist film PR2 to cover the first electrode E1, the pixel defining layer PDL, the first light emitting layer EM1, the first dummy light emitting layer DEM1, the third light emitting layer EM3, and the third dummy light emitting layer DEM3, patterning the second photoresist film PR2 and the second protective film SL2 such that a second opening pattern PTN2 corresponding to the second sub-pixel SP2 and at least some areas of the pixel defining layer PDL between the first sub-pixel SP1 and the third sub-pixel SP3 is formed, forming the second light emitting layer EM2 and a second dummy light emitting layer DEM2 corresponding to the second opening pattern PTN2, and stripping off the second photoresist film PR2 and the second protective film SL2.

In this case, the second opening pattern PTN2 may include a second sub-pixel opening OPS2 that opens the second sub-pixel SP2, and a second pixel defining layer opening OPP2 that opens at least some areas of the pixel defining layer PDL.

The second pixel defining layer opening OPP2 may include at least one of a second constant-spacing pixel defining layer opening EOPP2 and a second varying-spacing pixel defining layer opening NEOPP2.

The second constant-spacing pixel defining layer opening EOPP2 may be spaced apart from boundaries of the first sub-pixel SP1 and the third sub-pixel SP3 so as to have an equal spacing, and each second varying-spacing pixel defining layer opening NEOPP2 may be spaced apart from the boundary of each of the first sub-pixel SP1 and the third sub-pixel SP3 so as to have a width increasing or decreasing.

The dummy light emitting layer may be disposed to be spaced apart from the light emitting layer having the same color, and may be disposed at least partially overlapping with at least one of the light emitting layers having the different colors.

Because the dummy light emitting layer is not in a direct contact with the first electrode E1, the dummy light emitting layer may not contribute to the light emission.

The light emitting layers may include the red light emitting layer, the green light emitting layer, and the blue light emitting layer, and the dummy light emitting layer may include the red dummy light emitting layer, the green dummy light emitting layer, and the blue dummy light emitting layer.

The light emitting layer and the dummy light emitting layer having the same color may be made of the same material.

For example, the first dummy light emitting layer DEM1 may be disposed to be spaced apart from the first light emitting layer EM1 having the same color, and may be disposed to partially overlap with at least one of the second light emitting layer EM2 and the third light emitting layer EM3 having the different colors.

The dummy light emitting layer may be disposed between sub-pixels adjacent to each other to be spaced apart from the adjacent sub-pixels.

For example, the first dummy light emitting layer DEM1 may be disposed between the second sub-pixel SP2 and the third sub-pixel SP3 adjacent to each other so as to be spaced apart from the second sub-pixel SP2 and the third sub-pixel SP3 adjacent to each other.

The dummy light emitting layer may be in direct contact with at least one light emitting layer having the different color.

For example, the first dummy light emitting layer DEM1 may be in direct contact with at least one of the second light emitting layer EM2 and the third light emitting layer EM3 having the different colors.

The dummy light emitting layer may include the constant-spacing dummy light emitting layer and the varying-spacing dummy light emitting layer.

The constant-spacing dummy light emitting layer may be disposed along a direction in which the sub-pixels having the same color are arranged adjacent to each other, and the varying-spacing dummy light emitting layer may be disposed along a direction in which the sub-pixels having the different colors are arranged adjacent to each other.

For example, the first dummy light emitting layer DEM1 may include the first constant-spacing dummy light emitting layer EDEM1 and the first varying-spacing dummy light emitting layer NEDEM1.

The first constant-spacing dummy light emitting layer EDEM1 may be disposed along the first direction in which the second sub-pixels SP2 or the third sub-pixels SP3 having the same color are arranged adjacent to each other.

The first varying-spacing dummy light emitting layer NEDEM1 may be disposed along the second direction in which the second sub-pixel SP2 and the third sub-pixel SP3 having the different colors are arranged adjacent to each other.

The constant-spacing dummy light emitting layer may be disposed between the sub-pixels having the different colors, and may be disposed so as to partially overlap with at least one light emitting layer having the different color.

For example, the first constant-spacing dummy light emitting layer EDEM1 may be disposed between the second sub-pixel SP2 and the third sub-pixel SP3 having the different colors, and may be disposed so as to partially overlap with at least one of the second light emitting layer EM2 and the third light emitting layer EM3 having the different colors.

The varying-spacing dummy light emitting layer may be disposed between the sub-pixels having the same color, and may be disposed so as to at least partially overlap the light emitting layer having the different color and the varying-spacing dummy light emitting layer having the different color.

For example, the first varying-spacing dummy light emitting layers NEDEM1 may be disposed between the second sub-pixels SP2 and between the third sub-pixels SP3 having the same color, respectively, and may be disposed so as to at least partially overlap with the second light emitting layer EM2 and the third light emitting layer EM3 having the different colors, and the second varying-spacing dummy light emitting layer NEDEM2 and the third varying-spacing dummy light emitting layer NEDEM3 having the different colors.

Referring to (a) and (b) in FIG. 13, the electron transporting layer ETL and the second electrode E2 may be formed to cover the plurality of light emitting layers and the plurality of dummy light emitting layers.

Because the electron transporting layer ETL and the second electrode E2 may be layers common to the plurality of sub-pixels, the electron transporting layer ETL and the second electrode E2 may be formed as the common layers covering the entire face of the display area DA, but the present disclosure may not be limited thereto. The electron transporting layer ETL and the second electrode E2 may be patterned in a pattern corresponding to each sub-pixel.

In a case of a high-resolution display device, since the distance between the adjacent sub-pixels SP1, SP2, and SP3 decreases, a lateral leakage current may occur between the sub-pixels SP1, SP2, and SP3 adjacent to each other.

For example, in the first sub-pixel SP1, the first electrode E1, the first light emitting layer EM1, and the second electrode E2 may be stacked, the hole injection layer HIL and/or the hole transporting layer HTL may be additionally disposed between the first electrode E1 and the first light emitting layer EM1, and the electron transporting layer ETL and/or the electron injection layer HIL may be additionally disposed between the first light emitting layer EM1 and the second electrode E2.

In the first sub-pixel SP1 having the above-described stacked structure, light corresponding to the first light emitting layer EM1 may be emitted.

Because the dummy light emitting layer disposed on the pixel defining layer PDL does not come into contact with the first electrode E1, the dummy light emitting layer may not emit the light.

However, even when the light emission does not occur in the dummy light emitting layer, the lateral leakage current may occur between the sub-pixels SP1, SP2, and SP3 adjacent to each other via the hole injection layer HIL or the hole transporting layer HTL.

However, according to an aspect of the present disclosure, the hole injection layers HIL or the hole transporting layers HTL of the sub-pixels adjacent to each other may be prevented from being connected to each other, so that the occurrence of the lateral leakage current via the hole injection layer HIL or the hole transporting layer HTL may be prevented.

Therefore, according to an aspect of the present disclosure, the dummy light emitting layer that is disposed on the pixel defining layer PDL and does not contribute to the light emission may serve to prevent the lateral leakage current from flowing between the sub-pixels SP1, SP2, and SP3 adjacent to each other.

For example, referring to an enlarged view of (b) in FIG. 13, an area in which the first dummy light emitting layer DEM1 and the third light emitting layer EM3 overlap with each other on the pixel defining layer PDL is enlarged.

On the pixel defining layer PDL, a first hole injection layer HIL1, a first hole transporting layer HTL1, the first dummy light emitting layer DEM1, a third hole injection layer HIL3, a third hole transporting layer HTL3, the third light emitting layer EM3, and the electron transporting layer ETL may be stacked in order.

As such, because the first dummy light emitting layer DEM1 is disposed not between the hole transporting layer HTL and the electron transporting layer ETL, but between the hole transporting layer HTL and the hole transporting layer HTL, the first dummy light emitting layer DEM1 may serve to block a current flow between the sub-pixels SP1, SP2, and SP3 adjacent to each other.

That is, because the first hole transporting layer HTL1 and the third hole transporting layer HTL3 are not in direct contact with each other and connection therebetween is able to be blocked by the first dummy light emitting layer DEM1, the lateral leakage current may be prevented from flowing between the sub-pixels SP1, SP2, and SP3 adjacent to each other.

The dummy light emitting layer may include the constant-spacing dummy light emitting layer and the varying-spacing dummy light emitting layer.

The constant-spacing dummy light emitting layer may be disposed along the direction in which the sub-pixels having the same color are arranged adjacent to each other, and the varying-spacing dummy light emitting layer may be disposed along the direction in which the sub-pixels having the different colors are arranged adjacent to each other.

Depending on a shape of the structure of the pixel defining layer PDL or a deposition environment of the light emitting layers, in a boundary area of the open area of the first electrode E1, a light emitting layer precipitate may be thinly deposited and thus a phenomenon in which current is concentrated may occur, resulting in the lateral leakage current.

Accordingly, according to an aspect of the present disclosure, in order to increase the lateral leakage current blocking effect, the width of the varying-spacing dummy light emitting layer may be increased so as to increase an area of the varying-spacing dummy light emitting layer in a direction in which the current is concentrated.

Because the varying-spacing dummy light emitting layer disposed as such may increase an electrical resistance, the lateral leakage current generated from the open area of the first electrode E1 where the current concentration phenomenon occurs may be effectively blocked.

Therefore, according to an aspect of the present disclosure, since the dummy light emitting layer includes not only the constant-spacing dummy light emitting layer, but also the varying-spacing dummy light emitting layer, the electric resistance by the dummy light emitting layer may be increased in a direction toward the area where the current concentration phenomenon occurs, so that the lateral leakage current may be more effectively blocked.

The display device according to an aspect of the present disclosure may be described as follows.

A first aspect of the present disclosure provides a method for manufacturing a display device, the method comprising: forming a first electrode on a substrate and forming a pixel defining layer on the first electrode to separate a plurality of sub-pixels including a first sub-pixel, a second sub-pixel, and a third sub-pixel from each other; forming a first protective film and a first photoresist film so as to cover the first electrode and the pixel defining layer; patterning the first photoresist film and the first protective film to form a first opening pattern corresponding to the first sub-pixel and at least some areas of the pixel defining layer between the second sub-pixel and the third sub-pixel; forming a first light emitting layer and a first dummy light emitting layer corresponding to the first opening pattern; and stripping off the first photoresist film and the first protective film.

In one implementation of the first aspect, the method further comprises: after the stripping off the first photoresist film and the first protective film, forming a third protective film and a third photoresist film so as to cover the first electrode, the pixel defining layer, the first light emitting layer, and the first dummy light emitting layer; patterning the third photoresist film and the third protective film to form a third opening pattern corresponding to the third sub-pixel and at least some areas of the pixel defining layer between the first sub-pixel and the second sub-pixel; forming a third light emitting layer and a third dummy light emitting layer corresponding to the third opening pattern; and stripping off the third photoresist film and the third protective film.

In one implementation of the first aspect, the method further comprises: after the stripping off the third photoresist film and the third protective film, forming a second protective film and a second photoresist film so as to cover the first electrode, the pixel defining layer, the first light emitting layer, the first dummy light emitting layer, the third light emitting layer, and the third dummy light emitting layer; patterning the second photoresist film and the second protective film to form a second opening pattern corresponding to the second sub-pixel and at least some areas of the pixel defining layer between the first sub-pixel and the third sub-pixel; forming a second light emitting layer and a second dummy light emitting layer corresponding to the second opening pattern; and stripping off the second photoresist film and the second protective film.

In one implementation of the first aspect, the first protective film, the second protective film, and the third protective film contain a fluorine-based material, the patterning of the first protective film, the second protective film, and the third protective film includes developing the first protective film, the second protective film, and the third protective film with a fluorine-based solution so as to have an undercut structure, and the stripping off the first protective film, the second protective film, and the third protective film includes stripping t off he first protective film, the second protective film, and the third protective film with the fluorine-based solution.

In one implementation of the first aspect, the first opening pattern includes a first sub-pixel opening for opening the first sub-pixel, and a first pixel defining layer opening for opening the at least some areas of the pixel defining layer, the first pixel defining layer opening includes at least one of a first constant-spacing pixel defining layer opening and a first varying-spacing pixel defining layer opening, the first constant-spacing pixel defining layer opening is spaced apart from boundaries of the second sub-pixel and the third sub-pixel adjacent thereto so as to have an equal width, and each first varying-spacing pixel defining layer opening is spaced apart from the boundary of each of the second sub-pixel and the third sub-pixel adjacent thereto so as to have an increasing or decreasing width.

In one implementation of the first aspect, the third opening pattern includes a third sub-pixel opening for opening the third sub-pixel, and a third pixel defining layer opening for opening the at least some areas of the pixel defining layer, the third pixel defining layer opening includes at least one of a third constant-spacing pixel defining layer opening and a third varying-spacing pixel defining layer opening, the third constant-spacing pixel defining layer opening is spaced apart from boundaries of the first sub-pixel and the second sub-pixel adjacent thereto so as to have an equal width, and each third varying-spacing pixel defining layer opening is spaced apart from the boundary of each of the first sub-pixel and the second sub-pixel adjacent thereto so as to have an increasing or decreasing width.

In one implementation of the first aspect, the second opening pattern includes a second sub-pixel opening for opening the second sub-pixel, and a second pixel defining layer opening for opening the at least some areas of the pixel defining layer, the second pixel defining layer opening includes at least one of a second constant-spacing pixel defining layer opening and a second varying-spacing pixel defining layer opening, the second constant-spacing pixel defining layer opening is spaced apart from boundaries of the first sub-pixel and the third sub-pixel adjacent thereto so as to have an equal width, and each second varying-spacing pixel defining layer opening is spaced apart from the boundary of each of the first sub-pixel and the third sub-pixel adjacent thereto so as to have an increasing or decreasing width.

A second aspect of the present disclosure provides a method for manufacturing a display device, the method comprising: forming a first electrode on a substrate and forming a pixel defining layer on the first electrode to separate a plurality of sub-pixels from each other; forming a protective film and a photoresist film so as to cover the first electrode and pixel defining layer; patterning the photoresist film and the protective film such that an opening pattern for opening one of the plurality of sub-pixels and opening at least some areas on the pixel defining layer between the sub-pixels that are not opened is formed; depositing a light emitting layer and a dummy light emitting layer corresponding to the opening pattern; and stripping off the photoresist film and the protective film, wherein the forming of the photoresist film and the protective film to the stripping off the photoresist film and the protective film are able to be repeated as many as the number of colors constituting the plurality of sub-pixels.

In one implementation of the second aspect, the protective film contains a fluorine-based material, the patterning of the protective film includes developing the protective film with a fluorine-based solution so as to have an undercut structure, and the stripping off the protective film includes stripping off the protective film with the fluorine-based solution.

A third aspect of the present disclosure provides a display device comprising: a substrate; a first electrode disposed on the substrate; a pixel defining layer disposed on the first electrode to separate a plurality of sub-pixels from each other; a light emitting layer disposed on the first electrode; a dummy light emitting layer disposed on the pixel defining layer; and a second electrode disposed on the light emitting layer and the dummy light emitting layer, wherein the dummy light emitting layer is disposed to be spaced apart from a light emitting layer having the same color and is disposed at least partially overlapping with one or more light emitting layers having different colors.

In one implementation of the third aspect, the dummy light emitting layer is disposed between two adjacent sub-pixels and spaced apart from the two adjacent sub-pixels.

In one implementation of the third aspect, the dummy light emitting layer is in direct contact with the one or more light emitting layers having the different colors.

A fourth aspect of the present disclosure provides a display device comprising: a substrate; a first electrode disposed on the substrate; a pixel defining layer disposed on the first electrode to separate a plurality of sub-pixels from each other; a layer disposed on the first electrode; a dummy light emitting layer disposed on the pixel defining layer and including an constant-spacing dummy light emitting layer and a varying-spacing dummy light emitting layer; and a second electrode disposed on the light emitting layer and the dummy light emitting layer, wherein the constant-spacing dummy light emitting layer is spaced apart from a boundary of an adjacent sub-pixel so as to have an equal width, wherein the varying-spacing dummy light emitting layer is spaced apart from the boundary of the adjacent sub-pixel so as to have an increasing or decreasing width.

In one implementation of the fourth aspect, the constant-spacing dummy light emitting layer is disposed along an arrangement direction of adjacent sub-pixels having the same color, and the varying-spacing dummy light emitting layer is disposed along an arrangement direction of adjacent sub-pixels having different colors.

In one implementation of the fourth aspect, the constant-spacing dummy light emitting layer has a bar shape or a circular shape, and the varying-spacing dummy light emitting layer has a triangular shape or a sandglass shape.

In one implementation of the fourth aspect, the constant-spacing dummy light emitting layer is disposed between sub-pixels having different colors.

In one implementation of the fourth aspect, the constant-spacing dummy light emitting layer is disposed to at least partially overlap one or more light emitting layers having different colors.

In one implementation of the fourth aspect, the varying-spacing dummy light emitting layer is disposed between sub-pixels having the same color.

In one implementation of the fourth aspect, the varying-spacing dummy light emitting layer is disposed to at least partially overlap with light emitting layers having different colors and varying-spacing dummy light emitting layers having different colors.

In one implementation of the fourth aspect, the dummy light emitting layer is disposed between different hole transporting layers (HTL), or disposed between different electron transporting layers (ETL).

In one implementation of the fourth aspect, the light emitting layers include a red light emitting layer, a green light emitting layer, and a blue light emitting layer, and the dummy light emitting layers include a red dummy light emitting layer, a green dummy light emitting layer, and a blue dummy light emitting layer.

In one implementation of the fourth aspect, the light emitting layer and the dummy light emitting layer having the same color are made of the same material.

Although the aspects of the present disclosure have been described in more detail with reference to the accompanying drawings, the present disclosure is not necessarily limited to these aspects. The present disclosure may be implemented in various modified manners within the scope not departing from the technical idea of the present disclosure. Accordingly, the aspects disclosed in the present disclosure are not intended to limit the technical idea of the present disclosure, but to describe the present disclosure. The scope of the technical idea of the present disclosure is not limited by the aspects. Therefore, it should be understood that the aspects as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. A display device comprising:
a substrate;
a first electrode disposed on the substrate;
a pixel defining layer disposed on the first electrode to separate a plurality of sub-pixels from each other;
a first to third light emitting layer disposed on the first electrode;
a first to third dummy light emitting layer disposed on the pixel defining layer; and
a second electrode disposed on the first to third light emitting layer and the first to third dummy light emitting layer,
wherein the dummy light emitting layer is disposed to be spaced apart from a light emitting layer having a same color and is disposed at least partially overlapping with one or more light emitting layers having different colors, and
wherein, in a vertical direction based on a cross-sectional view, the first dummy light emitting layer is disposed between a first hole transporting layer (HTL1) and a third hole transporting layer (HTL3), and the third light emitting layer is disposed between the third hole transporting layer (HTL3) and an electron transporting layer (ETL).

2. The display device of claim 1, wherein the dummy light emitting layer is disposed between two adjacent sub-pixels and spaced apart from the two adjacent sub-pixels.

3. The display device of claim 1, wherein the dummy light emitting layer is in direct contact with the one or more light emitting layers having the different colors.

4. The display device of claim 1, wherein the light emitting layers include a red light emitting layer, a green light emitting layer, and a blue light emitting layer, and
wherein the dummy light emitting layers include a red dummy light emitting layer, a green dummy light emitting layer, and a blue dummy light emitting layer.

5. The display device of claim 1, wherein the first hole transporting layer (HTL1), the first dummy light emitting layer, the third hole transporting layer (HTL3), the third light emitting layer, the electron transporting layer (ETL), and the second electrode are sequentially stacked to overlap from bottom to top in a vertical direction.

6. The display device of claim 5, wherein a first hole injection layer (HIL1) is disposed below the first hole transporting layer (HTL1), and a third hole injection layer (HIL3) is additionally disposed between the first dummy light emitting layer and the third hole transporting layer (HTL3).

7. The display device of claim 6, wherein a bank layer is disposed at a boundary between adjacent sub-pixels, and
wherein, on the bank layer, the first hole injection layer (HIL1), the first hole transporting layer (HTL1), the first dummy light emitting layer, the third hole transporting layer (HTL3), the third hole injection layer (HIL3), the third light emitting layer, the electron transporting layer (ETL), and the second electrode are sequentially stacked from bottom to top in a vertical direction.

8. The display device of claim 1, further comprising:
a light-blocking layer disposed on the substrate;
a buffer layer disposed on the light-blocking layer; and
a thin-film transistor including an active layer, a gate electrode, a source electrode, and a drain electrode, disposed on the buffer layer,
wherein the thin-film transistor and the light-blocking layer are disposed to overlap each other in a vertical direction.

9. The display device of claim 8, further comprising:
an interlayer insulating layer disposed on the buffer layer to cover the active layer and the gate electrode; and
a first passivation layer disposed on the interlayer insulating layer to cover the source electrode and the drain electrode,
wherein the source electrode and the drain electrode are connected to the active layer through contact holes formed in the interlayer insulating layer, and
wherein the interlayer insulating layer has a thicker thickness than the buffer layer and the first passivation layer.

10. The display device of claim 9, further comprising:
an overcoat layer disposed between the first passivation layer and the first electrode,
wherein the first electrode is connected to the drain electrode through a contact hole formed in the overcoat layer, and
wherein the first passivation layer is made of an inorganic matter, and the overcoat layer is made of an organic matter.

11. The display device of claim 10, wherein a light emitting device layer including the light emitting layer is disposed between the first electrode and the second electrode, and
wherein the light emitting device layer is an organic light emitting diode.

12. The display device of claim 11, further comprising:
a planarization layer disposed on the second electrode so as to be in contact with the second electrode,
wherein the planarization layer is made of an organic matter.

13. The display device of claim 12, wherein a second passivation layer, an adhesive layer, and a sealing layer are sequentially stacked on the planarization layer from bottom to top in a vertical direction.

14. The display device of claim 12, wherein the dummy light emitting layer comprises:
a first dummy light emitting layer arranged along a first direction in which sub-pixels having the same color are arranged in a plan view; and
a second dummy light emitting layer arranged along a second direction in which sub-pixels having different colors are arranged in a plan view,
wherein the first direction and the second direction are orthogonal to each other,
and the first dummy light emitting layer and the second dummy light emitting layer are arranged not to overlap each other with respect to the first direction and the second direction.

* * * * *